(12) United States Patent
Morinaga et al.

(10) Patent No.: US 7,239,934 B2
(45) Date of Patent: Jul. 3, 2007

(54) SYSTEM AND METHOD FOR DELIVERING WRITING DATA OF A SEMICONDUCTOR DEVICE AND FABRICATING A SEMICONDUCTOR DEVICE

(75) Inventors: Hiroyuki Morinaga, Yokohama (JP); Takema Ito, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 356 days.

(21) Appl. No.: 10/901,371

(22) Filed: Jul. 29, 2004

(65) Prior Publication Data
US 2005/0177268 A1   Aug. 11, 2005

(30) Foreign Application Priority Data
Jan. 22, 2004   (JP) .......................... P2004-014209

(51) Int. Cl.
*G06F 19/00*   (2006.01)
(52) U.S. Cl. ...................................... 700/121; 700/116
(58) Field of Classification Search ........ 700/115–121; 707/10, 100
See application file for complete search history.

(56) References Cited

U.S. PATENT DOCUMENTS

| | | | |
|---|---|---|---|
| 6,313,476 B1 * | 11/2001 | Shimizu et al. | 250/492.22 |
| 6,336,056 B1 * | 1/2002 | Fujimoto et al. | 700/121 |
| 6,544,698 B1 * | 4/2003 | Fries | 430/22 |
| 6,578,188 B1 * | 6/2003 | Pang et al. | 716/19 |
| 6,591,207 B2 * | 7/2003 | Naya et al. | 702/81 |
| 6,674,086 B2 * | 1/2004 | Kamada et al. | 250/492.22 |
| 6,686,914 B2 * | 2/2004 | Keener | 345/420 |
| 6,725,237 B2 * | 4/2004 | Clairmont et al. | 707/104.1 |
| 6,828,542 B2 * | 12/2004 | Ye et al. | 250/208.1 |
| 7,041,512 B2 * | 5/2006 | Fujiyoshi et al. | 438/5 |
| 7,079,994 B2 * | 7/2006 | Inanami et al. | 703/6 |
| 2002/0157068 A1 * | 10/2002 | LaCour et al. | 716/3 |
| 2003/0029912 A1 * | 2/2003 | Li et al. | 235/375 |
| 2004/0104357 A1 * | 6/2004 | Fujiyoshi et al. | 250/491.1 |
| 2004/0107412 A1 * | 6/2004 | Pack et al. | 716/19 |
| 2004/0117757 A1 * | 6/2004 | Inanami et al. | 716/21 |
| 2004/0133369 A1 * | 7/2004 | Pack et al. | 702/59 |
| 2004/0181769 A1 * | 9/2004 | Kochpatcharin et al. | 716/19 |
| 2005/0119843 A1 * | 6/2005 | Naya et al. | 702/81 |
| 2005/0216878 A1 * | 9/2005 | Word et al. | 716/21 |
| 2005/0246049 A1 * | 11/2005 | Suttile et al. | 700/117 |
| 2006/0000964 A1 * | 1/2006 | Ye et al. | 250/208.1 |

FOREIGN PATENT DOCUMENTS

JP   2002-351931   12/2002

* cited by examiner

*Primary Examiner*—M. N. Von Buhr
(74) *Attorney, Agent, or Firm*—Finnegan, Henderson, Farabow, Garrett & Dunner, L.L.P.

(57) ABSTRACT

A design system for delivering data via a network to a plant, which fabricates a semiconductor device by direct writing, includes: a data conversion unit generating the data specified by a product name of the semiconductor device, a layer name, and a machine type of an electron beam lithography system for the direct writing; a central memory unit recording the data; and a plant mediator distributing the data to the plant via the network, and re-distributing the data to the plant in response to a download request associated with the product name, the layer name, and the machine type.

19 Claims, 26 Drawing Sheets

WRITING DATA REGISTRATION AND DISTRIBUTION REQUEST INFORMATION

| PRODUCT NAME | |
|---|---|
| LAYER NAME | |
| USER INFORMATION | |
| MACHINE TYPE | |
| WAFER PLANT NAME | |
| WRITING DATA FILE | |

FIG. 14

DATABASE

| PRODUCT NAME | LAYER NAME | MACHINE TYPE | DIRECT WRITING DATA |
|---|---|---|---|
|  |  |  |  |
|  |  |  |  |
|  |  |  |  |
|  |  |  |  |
|  |  |  |  |

73 — PRODUCT NAME
74 — LAYER NAME
75 — MACHINE TYPE
76 — DIRECT WRITING DATA
77 — each row

FIG. 17

LOT STATUS MEMORY UNIT     ITEMS                    (EB LOT INFORMATION)

| PRODUCT NAME | LAYER NAME | MACHINE TYPE | LOT NUMBER | ACCESS TIME | REMOVABILITY FLAG | |
|---|---|---|---|---|---|---|
| | | | | | | }87 |
| | | | | | | }87 |
| | | | | | | }87 |
| | | | | | | }87 |
| | | | | | | }87 |

DOWNLOAD REQUEST INFORMATION

| PRODUCT NAME | |
|---|---|
| LAYER NAME | |
| USER INFORMATION | |
| MACHINE TYPE | |
| WAFER PLANT NAME | |

FIG. 20

EB LOT STATUS MEMORY UNIT   ITEMS

| PRODUCT NAME | LAYER NAME | MACHINE TYPE | LOT NUMBER | ACCESS TIME | REMOVABILITY FLAG | |
|---|---|---|---|---|---|---|
| PRODUCT A | M1 | E1 | LotA | OCTOBER, 2001 | YES | }88 |
| PRODUCT A | M2 | E1 | LotA | OCTOBER, 2001 | YES | }89 |
| PRODUCT A | M1 | E1 | LotB | OCTOBER, 2002 | YES | }90 |
| PRODUCT A | M2 | E1 | LotB | OCTOBER, 2002 | YES | }91 |
| PRODUCT A | M1 | E1 | LotC | OCTOBER, 2003 | YES | }92 |
| PRODUCT A | M2 | E1 | LotC | OCTOBER, 2003 | YES | }93 |
| PRODUCT B | M1 | E2 | LotD | NOVEMBER, 2002 | YES | }94 |
| PRODUCT B | M2 | E2 | LotD | NOVEMBER, 2002 | YES | }95 |
| PRODUCT B | M1 | E2 | LotE | DECEMBER, 2002 | YES | }96 |
| PRODUCT B | M2 | E2 | LotE | DECEMBER, 2002 | YES | }97 |
| 81 | 82 | 83 | 84 | 85 | 86 | |

FIG. 21
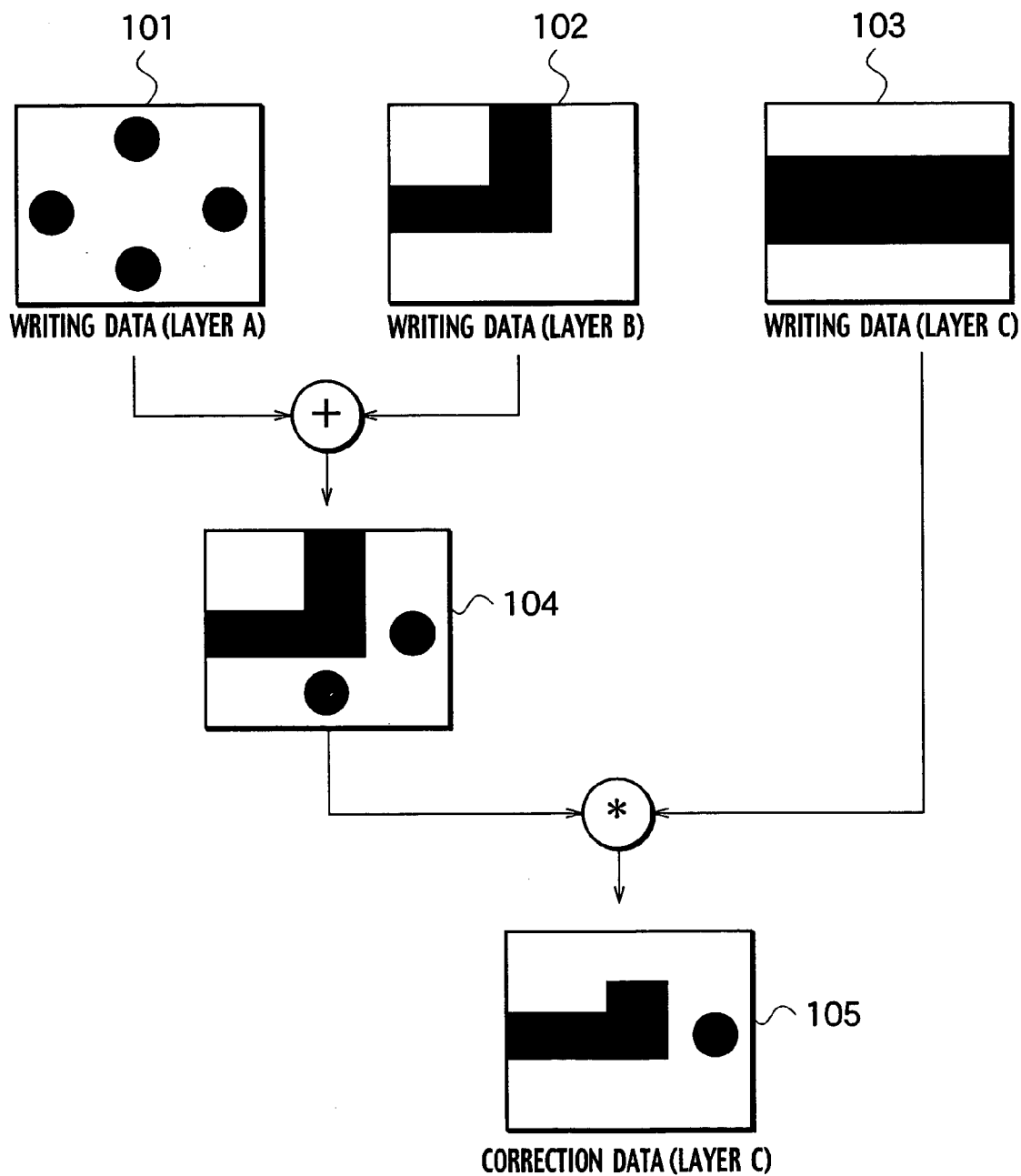
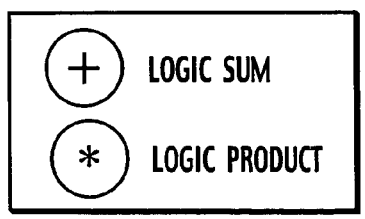

FIG. 22

CORRECTION DATA GENERATION, REGISTRATION, AND DISTRIBUTION REQUEST INFORMATION

| PRODUCT NAME | |
|---|---|
| TO-BE-CORRECTED LAYER NAME | |
| CORRECTION MODEL | |
| USER INFORMATION | |
| MACHINE TYPE | |
| WAFER PLANT NAME | |

FIG. 23

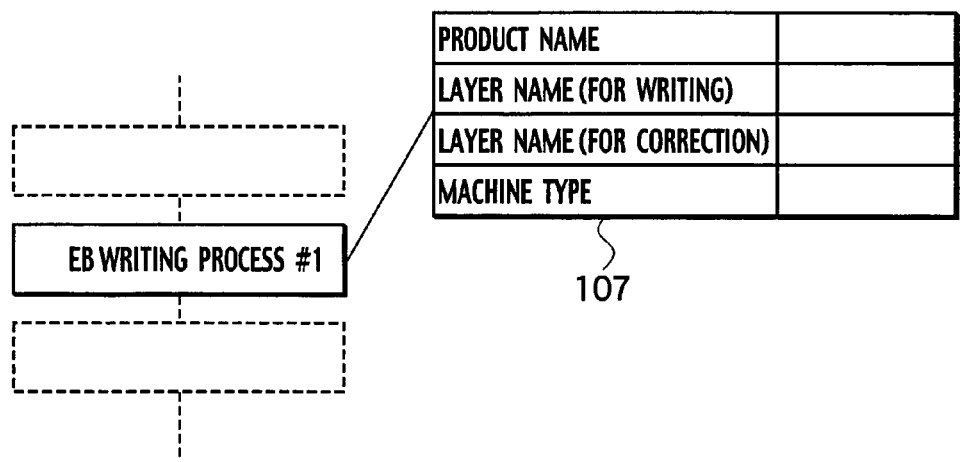

| PRODUCT NAME | |
|---|---|
| LAYER NAME (FOR WRITING) | |
| LAYER NAME (FOR CORRECTION) | |
| MACHINE TYPE | |

LOT STATUS MEMORY UNIT ITEMS (INCLUDING CORRECTION DATA)

| PRODUCT NAME | LAYER NAME (FOR WRITING) | LAYER NAME (FOR CORRECTION) | MACHINE TYPE | LOT NUMBER | ACCESS TIME | REMOVABILITY FLAG | |
|---|---|---|---|---|---|---|---|
| | | | | | | | }87 |
| | | | | | | | }87 |
| | | | | | | | }87 |
| | | | | | | | }87 |
| | | | | | | | }87 |
| 81 | 82 | 108 | 83 | 84 | 85 | 86 | |

FIG. 30

SUB DATABASE

| PRODUCT NAME | LAYER NAME | MACHINE TYPE | RECORDING MEDIUM IDENTIFIER : FILE NAME | LATEST ACCESS TIME | SLOT OR STORAGE |
|---|---|---|---|---|---|
| DEV01 | LAYER1 | EQ1 | 00001 : DEV01_LAYER1_EQ1 | | |
| DEV01 | LAYER2 | EQ1 | 00001 : DEV01_LAYER2_EQ1 | | |
| DEV01 | LAYER3 | EQ1 | 00001 : DEV01_LAYER3_EQ1<br>00002 : DEV01_LAYER3_EQ1 | | |
| DEV01 | LAYER4 | EQ1 | 00002 : DEV01_LAYER4_EQ1 | | |
| | | | | | |

FIG. 31
| SLOT IDENTIFIER | RECORDING MEDIUM IDENTIFIER |
|---|---|
| 1 | 00001 |
| 2 | 00002 |
| 3 | 00004 |
131 · 132 · 133
FIG. 32A
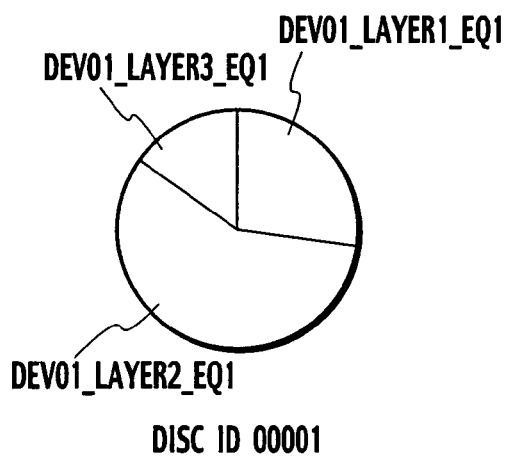
DISC ID 00001
FIG. 32B
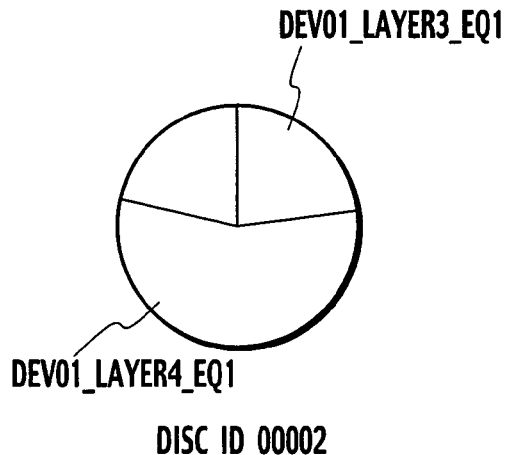
DISC ID 00002

SYSTEM AND METHOD FOR DELIVERING WRITING DATA OF A SEMICONDUCTOR DEVICE AND FABRICATING A SEMICONDUCTOR DEVICE

CROSS REFERENCE TO RELATED APPLICATIONS

This application is based upon and claims the benefit of priority from prior Japanese Patent Applications No. P2004-14209, filed on Jan. 22, 2004; the entire contents of which are incorporated herein by reference.

BACKGROUND OF THE INVENTION

1. Field of the Invention

The present invention relates to a design system for delivering data, system for fabricating a semiconductor device, method of communication writing data, method for fabricating a semiconductor device, which manage electron beam (EB) direct writing data to be used to carry out EB direct writing in fabrication of semiconductor devices.

2. Description of the Related Art

In fabrication of semiconductor devices, patterning of semiconductor devices is repeated. An exposure method using photo masks and an electron-beam (EB) direct writing method are used for patterning semiconductor devices. Since patterns formed through patterning are unique to respective semiconductor device products, there are numerous patterns maintained in a manufacturing plant. Therefore, regarding an exposure method using photo masks, a management method of photo mask writing data to be used to carry out writing of photo masks has been proposed for systematic fabrication of semiconductor devices.

On the other hand, regarding an EB direct writing method, a management method of EB direct writing data used to carry out EB direct writing has not yet been proposed. An EB direct writing method is used for urgent production demands, for example, when fabricating few semiconductor devices, or when fabricating prototypes of semiconductor devices. However, EB direct writing data is manually controlled. Therefore, there is a need for a management method for EB direct writing data.

SUMMARY OF THE INVENTION

According to an aspect of the present invention, a design system for delivering writing data through a network to a plant is provided, which fabricates a semiconductor device by direct writing using the writing data. This system includes a data conversion unit configured to generate the writing data used in the direct writing, the data being specified by a product name of the semiconductor device, a layer name, and a machine type of an electron beam lithography system used for the direct writing; a central memory unit configured to record the writing data; and a plant mediator configured to distribute the writing data to the plant through the network, and to re-distribute the data to the plant in response to a download request associated with the product name, the layer name, and the machine type from the plant.

According to another aspect of the present invention, a system connected to a first network for fabricating a semiconductor device is provided. This system includes a design mediator configured to receive at least one of circuit data and layout data being converted to writing data from a design unit through the first network; a data conversion unit configured to generate the writing data; a central memory unit configured to record the writing data; a plant mediator configured to distribute the writing data through the second network; a control unit configured to receive the writing data from the plant mediator through a second network; a plant memory unit configured to record the received writing data; and a lithography system configured to carry out electron beam direct writing using the writing data and fabricating the semiconductor device.

According to still another aspect of the present invention, a system connected to a network for fabricating a semiconductor device is provided. This system includes a control unit configured to receive writing data used in direct writing from a design system through the network; a plant memory unit configured to record the writing data; and a lithography system configured to carry out electron beam direct writing using the writing data, wherein the plant memory unit erases the writing data when the electron beam direct writing using that writing data is not carried out; and the control unit retrieves the writing data stored in the plant memory unit, issues a download request for the writing data to the design system when no data is stored, and receives the writing data again from the design system.

According to still another aspect of the present invention, a method of communicating writing data to be received via a network by a plant, which carries out electron beam direct writing using the writing data and fabricates a semiconductor device by direct writing, is provided. This method includes generating the writing data; recording the writing data; and distributing the writing data to the plant through the network, and redistributing the writing data to the plant in response to a download request from the plant.

According to still another aspect of the present invention, a method for fabricating a semiconductor device by direct writing, is provided. This method includes receiving from a design unit through a first network, at least one of circuit data and layout data convertable to a writing data; generating the writing data based on at least one of the circuit data and the layout data; recording the generated writing data in a central memory unit; distributing the writing data to a plant through a second network; recording the writing data received by the plant, in a plant memory unit; and carrying out electron beam direct writing using the writing data.

According to still another aspect of the present invention, a method for fabricating a semiconductor device by direct writing, is provided. This method includes receiving writing data from a design system through a network; recording the writing data in a plant memory unit; carrying out electron beam direct writing using the writing data; removing the writing data from the plant memory unit when electron beam direct writing using the writing data is not carried out; and retrieving the writing data stored in the plant memory unit, issuing a download request for the writing data to the design system when the writing data is not stored, and receiving the writing data again from the design system.

BRIEF DESCRIPTION OF THE DRAWINGS

FIG. 14 is a table showing the data structure of an EB database;

FIG. 17 is a table showing the data structure of EB lot information;

FIG. 18 is a table showing the data structure of EB data download request information;

FIG. 20 is a table showing the data structure of EB lot information;

FIG. 21 is a diagram describing a method of generating EB correction data of a fourth embodiment of the present invention;

FIG. 22 is a table showing the data structure of EB correction data generation, registration, and distribution request information;

FIG. 23 shows a process flow information of a semiconductor device fabrication process using EB correction data;

FIG. 24 is a table showing the data structure of EB lot information;

FIG. 30 is a table showing the data structure of a sub EB database of an EB database in the central memory unit;

FIG. 31 is a table showing the data structure of a slot identifier/recording medium identifier database of the EB database in the central memory unit; and FIGS. 32A and 32B are circular graphs showing the relationship between available disk space and writing data file size.

DETAILED DESCRIPTION OF THE INVENTION

Figure 1:
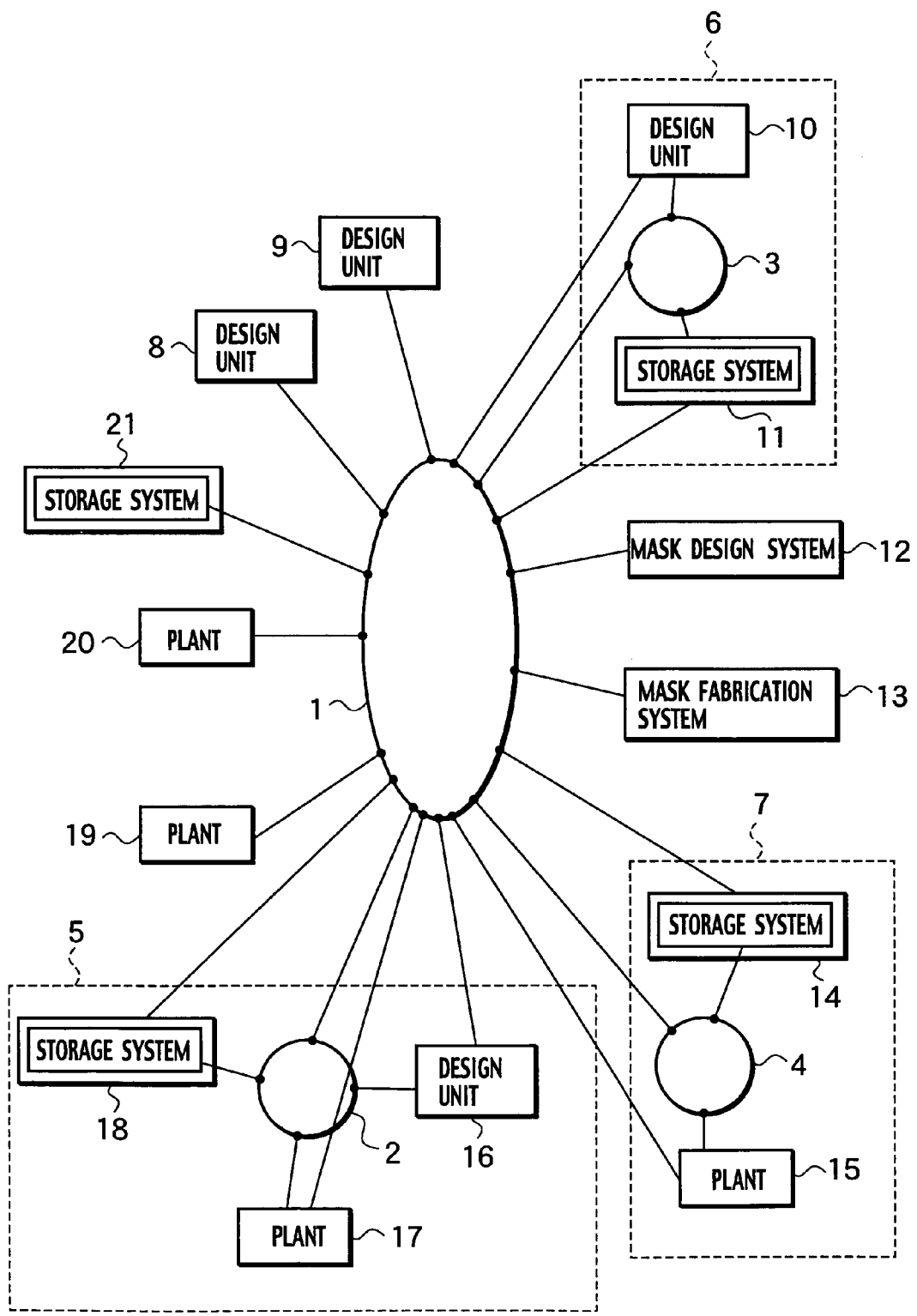
FIG. 1 shows connections of a network including a semiconductor device design and fabrication system according to a first embodiment of the present invention.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

FIRST EMBODIMENT

As shown in FIG. 1, design units 8 through 10 and 16, storage systems 11, 14, 18, and 21, plants 15, 17, 19, and 20, a mask design system 12, and a mask fabrication system 13 are connected to one another via the Internet 1 and local area networks (LANs) 2 through 4, so as to configure a network. The design units 8, 10, and 16 have the same structure. The storage systems 11, 14, 18 and 21 have the same structure. The plants 15, 17, 19, and 20 have the same structure.

A semiconductor device design and fabrication system 5 of the first embodiment includes at least one of the design units 8 through 10 and 16, at least one of the storage systems 11, 14, 18, and 21, and at least one of the plants 15, 17, 19, and 20. For example, the semiconductor device design and fabrication system 5 may be made up of the design unit 16, the storage system 18, and the plant 17, which are connected to the LAN 2. Alternatively, the semiconductor device design and fabrication system 5 may be made up of the design unit 8, the storage system 21, and the plant 20, which are connected to the Internet 1.

A semiconductor device design system 6 of the first embodiment includes at least one of the design units 8 through 10 and 16 and at least one of the storage systems 11, 14, 18, and 21. For example, the semiconductor device design system 6 may be made up of the design unit 10 and the storage system 11, which are connected to the LAN 3. Alternatively, the semiconductor device design system 6 may be made up of the design unit 8 and the storage system 21, which are connected to the Internet 1.

A semiconductor device fabrication system 7 of the first embodiment includes at least one of the plants 15, 17, 19, and 20, and may further include at least one of the storage systems 11, 14, 18, and 21. For example, semiconductor device fabrication system 7 may be made up of the storage system 14 and the plant 15, which are connected to the LAN 4. Alternatively, the semiconductor device fabrication system 7 may be made up of the storage system 21 and the plant 20, which are connected to the Internet 1, or may be made up of only the plant 19 connected to the Internet 1.

Figure 2:
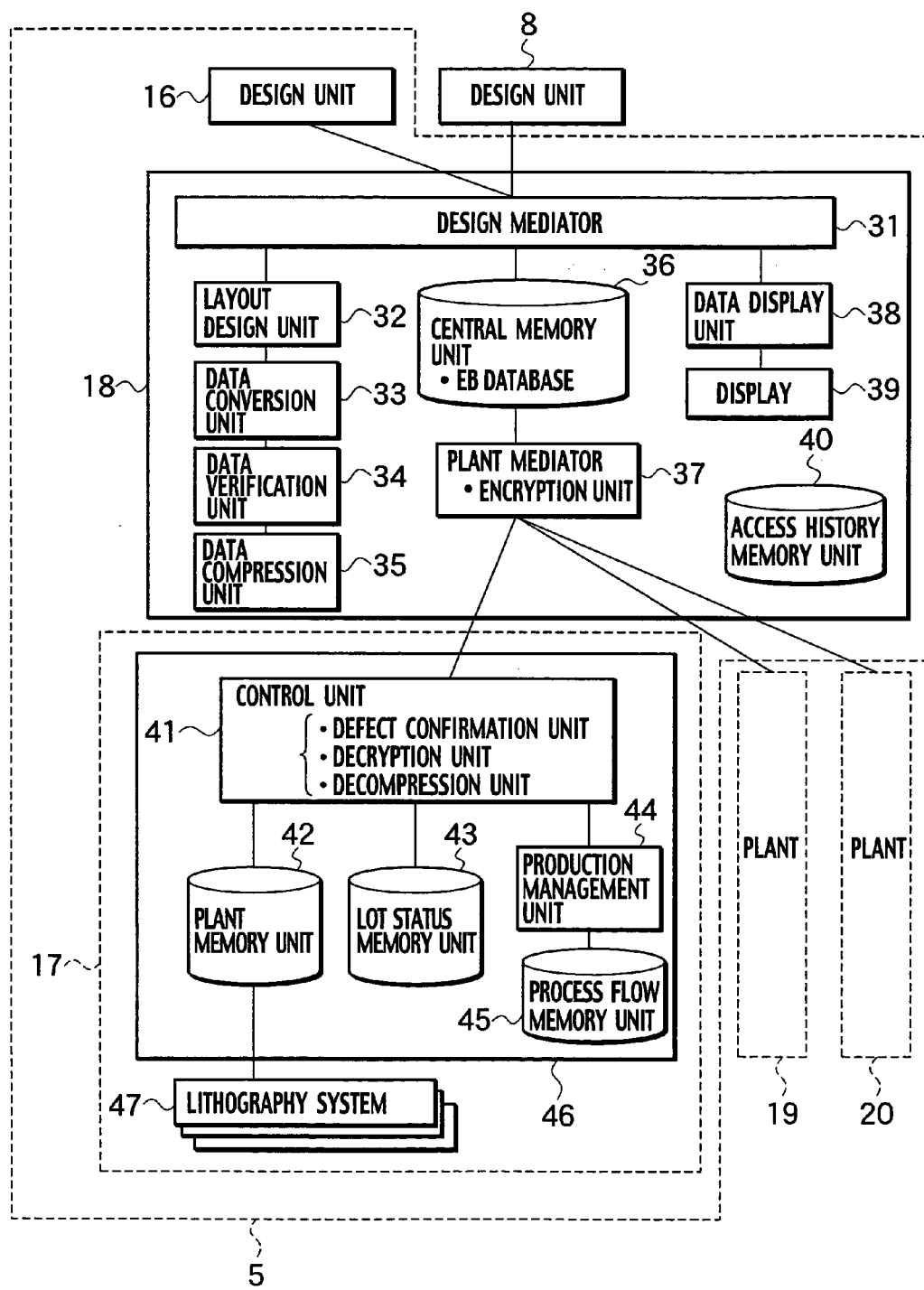
FIG. 2 is a block diagram of the semiconductor device design and fabrication system according to the first embodiment of the present invention.

As shown in FIG. 2, the semiconductor device design and fabrication system 5 includes the design unit 16, the storage system 18, and the plant 17. The storage system 18 includes a design mediator 31, a layout design unit 32, a data conversion unit 33, a data verification unit 34, a data compression unit 35, a central memory unit 36, a plant mediator 37, a data display unit 38, a display 39, and an access history memory unit 40. The central memory unit 36 includes an EB database. The plant mediator 37 includes an encryption unit.

The plant 17 includes a data request system 46 and an electron beam lithography system 47. The data request system 46 includes a control unit 41, a plant memory unit 42, a lot status memory unit 43, a production management unit 44, and a process flow memory unit 45. The control unit 41 includes a defect confirmation unit, a decryption unit, and a decompression unit.

Figure 3:
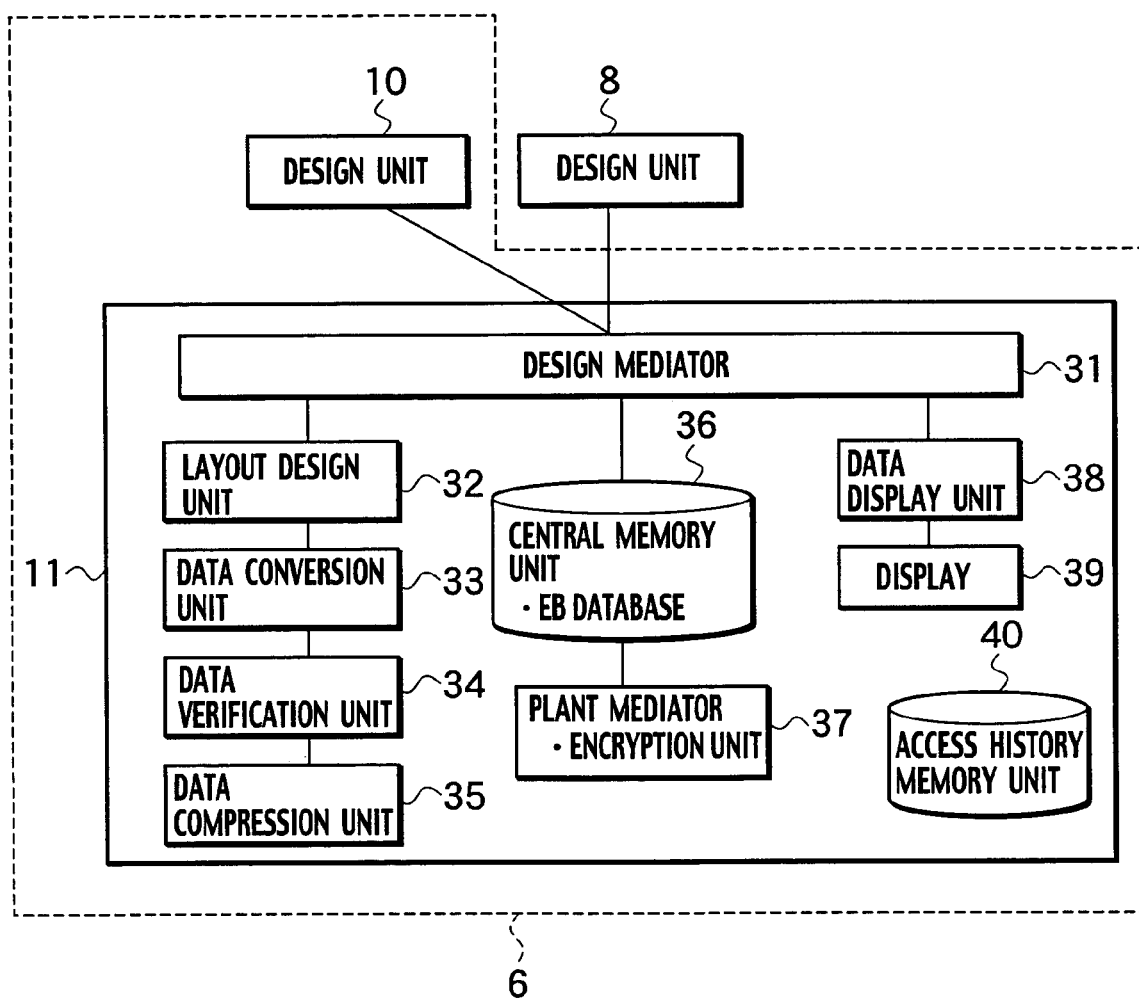
FIG. 3 is a block diagram of the semiconductor device design system according to the first embodiment of the present invention.

As shown in FIG. 3, the semiconductor device design system 6 includes the design unit 10 and the storage system 11. The storage system 11 has the same structure as the storage system 18 in FIG. 2. The semiconductor device design system 6 has the same structure as the semiconductor device design and fabrication system 5 in FIG. 2 except that the plant 17 is omitted.

Figure 4:
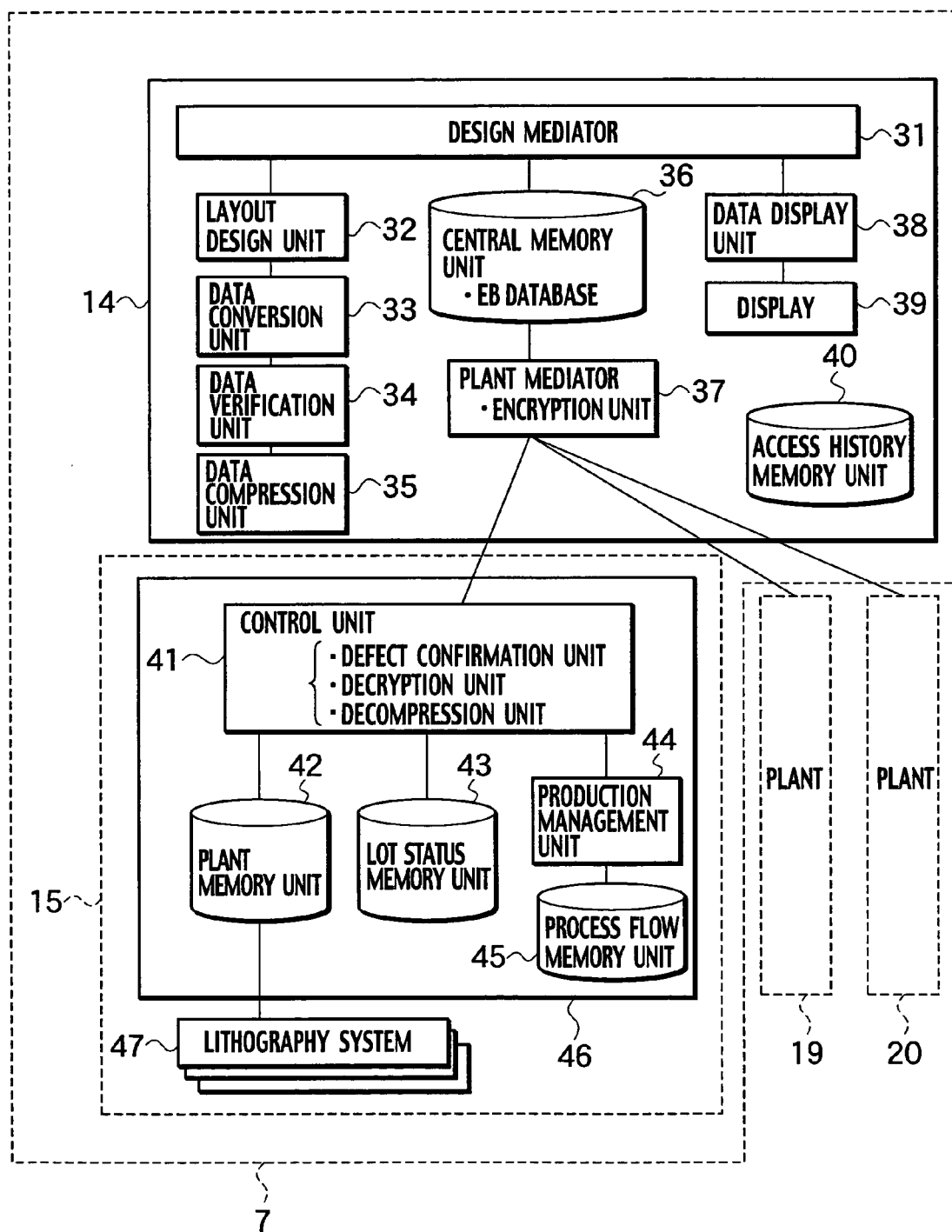
FIG. 4 is a block diagram of the semiconductor device fabrication system according to the first embodiment of the present invention.

As shown in FIG. 4, the semiconductor device fabrication system 7 includes the storage system 14 and the plant 15. The storage system 14 has the same structure as the storage system 18 in FIG. 2. The plant 15 has the same structure as the plant 17 in FIG. 2. The semiconductor device fabrication system 7 has the same structure as the semiconductor device design and fabrication system 5 in FIG. 2 except that the design unit 16 is omitted.

Figure 5:
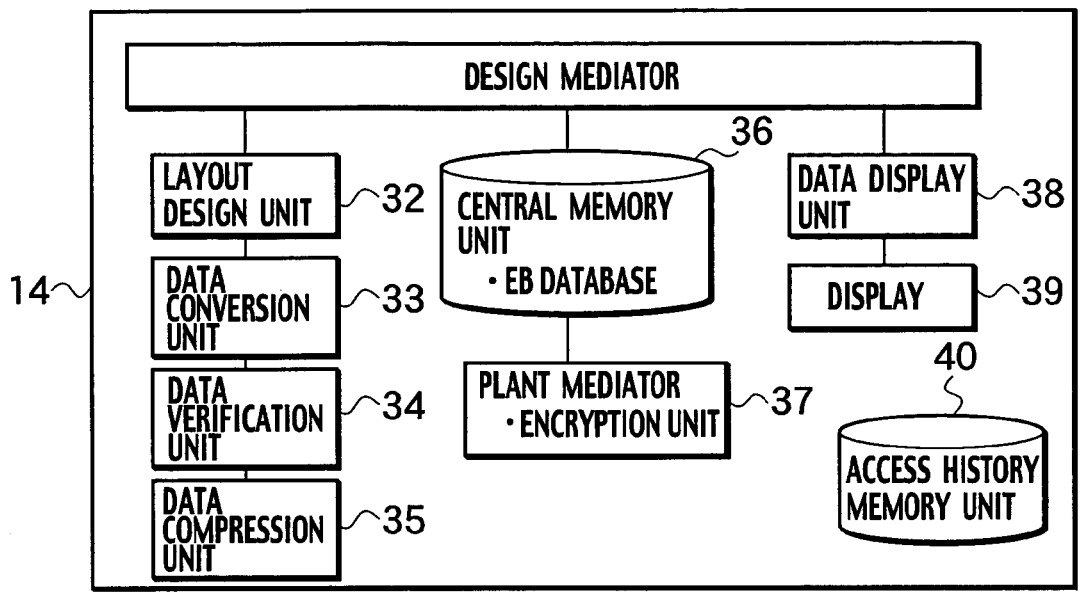
FIG. 5 is a block diagram of a storage system in the semiconductor device design and fabrication system according to the first embodiment of the present invention.

As shown in FIG. 5, the storage system 21 in the semiconductor device design and fabrication system 5 has the same structure as the storage system 18 in FIG. 2, the storage system 11 in FIG. 3, and the storage system 14 in FIG. 4.

Figure 6:
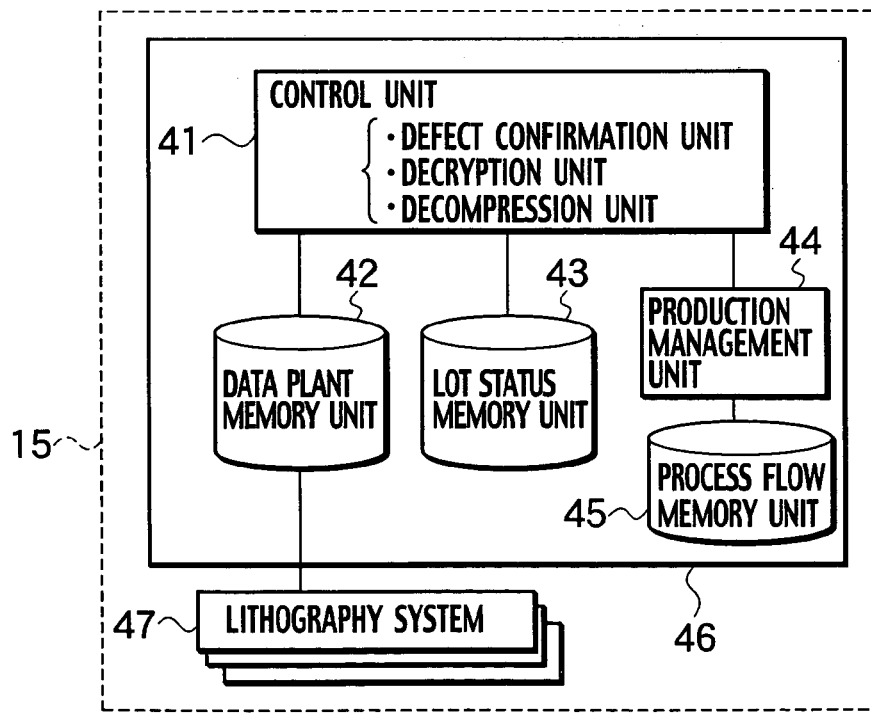
FIG. 6 is a block diagram of a plant with the semiconductor device design and fabrication system according to the first embodiment of the present invention.

As shown in FIG. 6, the plant 19 including the semiconductor device design and fabrication system 5 has the same structure as the plant 17 in FIG. 2 and the plant 15 in FIG. 4.

Figure 7:
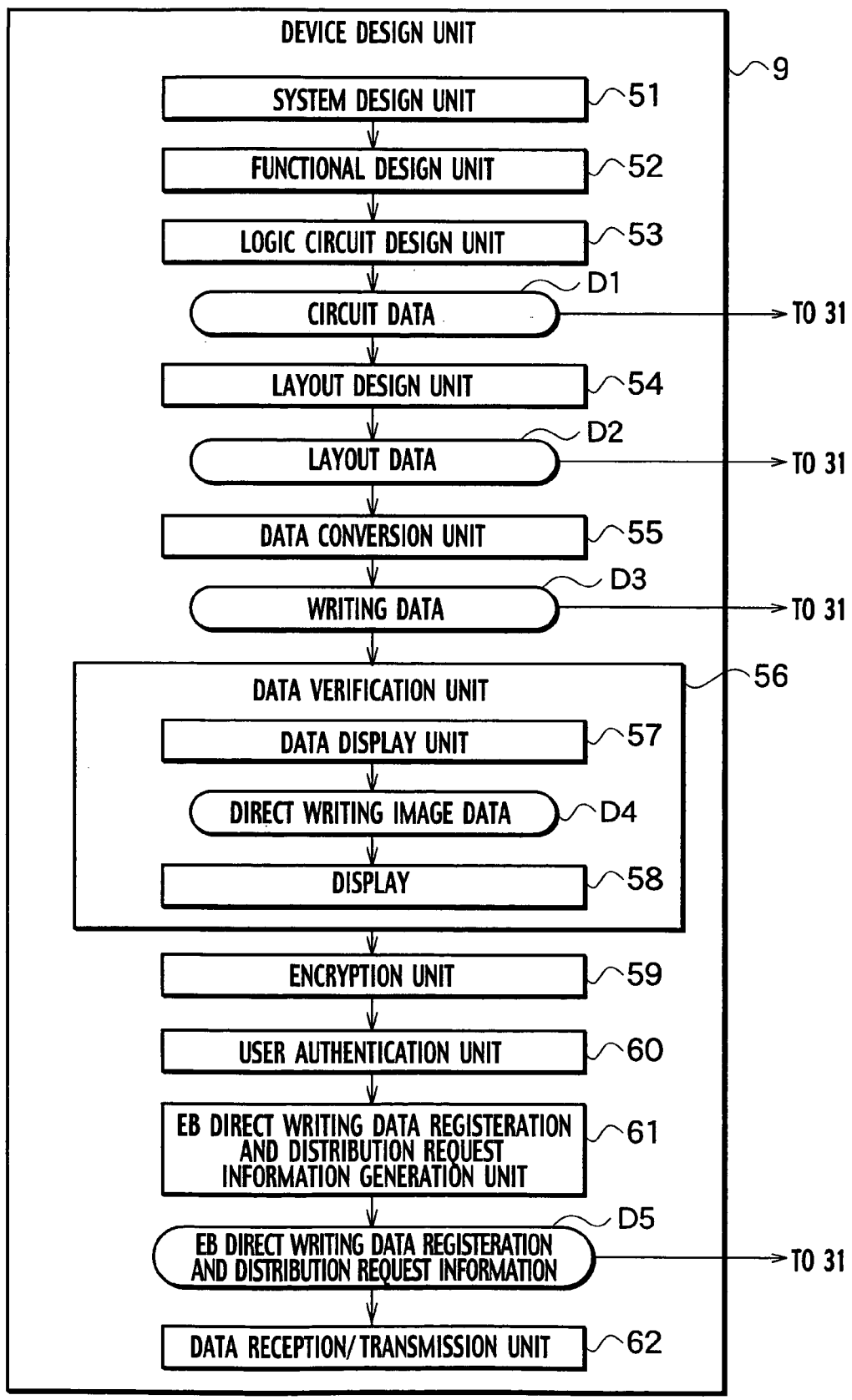
FIG. 7 is a block diagram of a design unit with the semiconductor device design and fabrication system according to the first embodiment of the present invention.

As shown in FIG. 7, the design unit 9 includes a system design unit 51, a functional design unit 52, a logic circuit design unit 53, a layout design unit 54, a data conversion unit 55, a data verification unit 56, an encryption unit 59, a user authentication unit 60, a writing data registration and distribution request information generation unit 61, and a data reception/transmission unit 62. The data verification unit 56 includes a data display unit 57 and a display 58. Note that the design unit 9 may be a computer, and may be implemented by instructing the computer to execute sequences in a program. Typically, the design unit 9 belongs to a design department or a design company. The design units 8, 10, and 16 have the same structure as the design unit 9 in FIG. 7 except that the layout design unit 54, the data conversion unit 55, and the data verification unit 56 are omitted.

Figure 8:
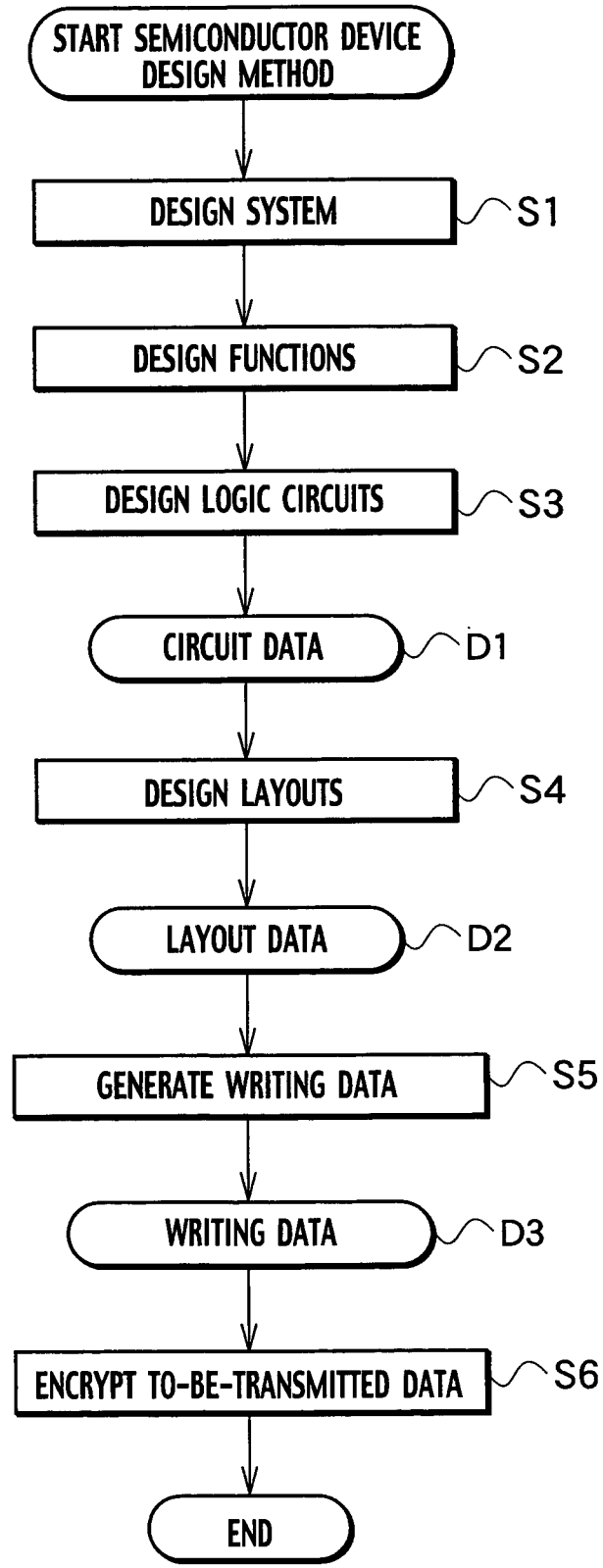
FIG. 8 is a flowchart for a semiconductor device design method regarding the semiconductor device design and fabrication method according to the first embodiment of the present invention.

As shown in FIG. 8, according to a semiconductor device design method, to begin with in step S1, the system design unit 51 designs a system including a semiconductor device. In step S2, the functional design unit 52 designs functions required for the semiconductor device based on the designed system. In step S3, the logic circuit design unit 53 designs logic circuits for the semiconductor device based on the designed functions. The logic circuit design unit 53 outputs the designed logic circuits as circuit data D1. In step S4, the layout design unit 54 designs a layout of the semiconductor device based on the designed logic circuits, when possible. The layout design unit 54 outputs the designed layout as layout data D2. Typically, the layout data D2 is provided in a CAD format, such as GDS2. In step S5, the data conversion unit 55 generates writing data D3, if possible. The EB data verification unit 56 verifies the generated writing data D3. The EB data display unit 57 converts the writing data D3 to direct writing image data D4. The data verification unit 56 determines whether the direct writing image data D4 satisfies an EB writing rule. Note that the data verification unit 56 may display the direct writing image data D4 on the display 58 and prompt an operator to determine whether the direct writing image data D4 satisfies the EB writing rule. In response, the operator inputs the determination results to the data verification unit 56. The data verification unit 56 determines whether the EB writing rule is satisfied based on this determination results. In step S6, the encryption unit 59 encrypts to-be-transmitted data. The to-be-transmitted data includes the circuit data D1, and if possible, the layout data D2 and the writing data D3.

Figure 9:
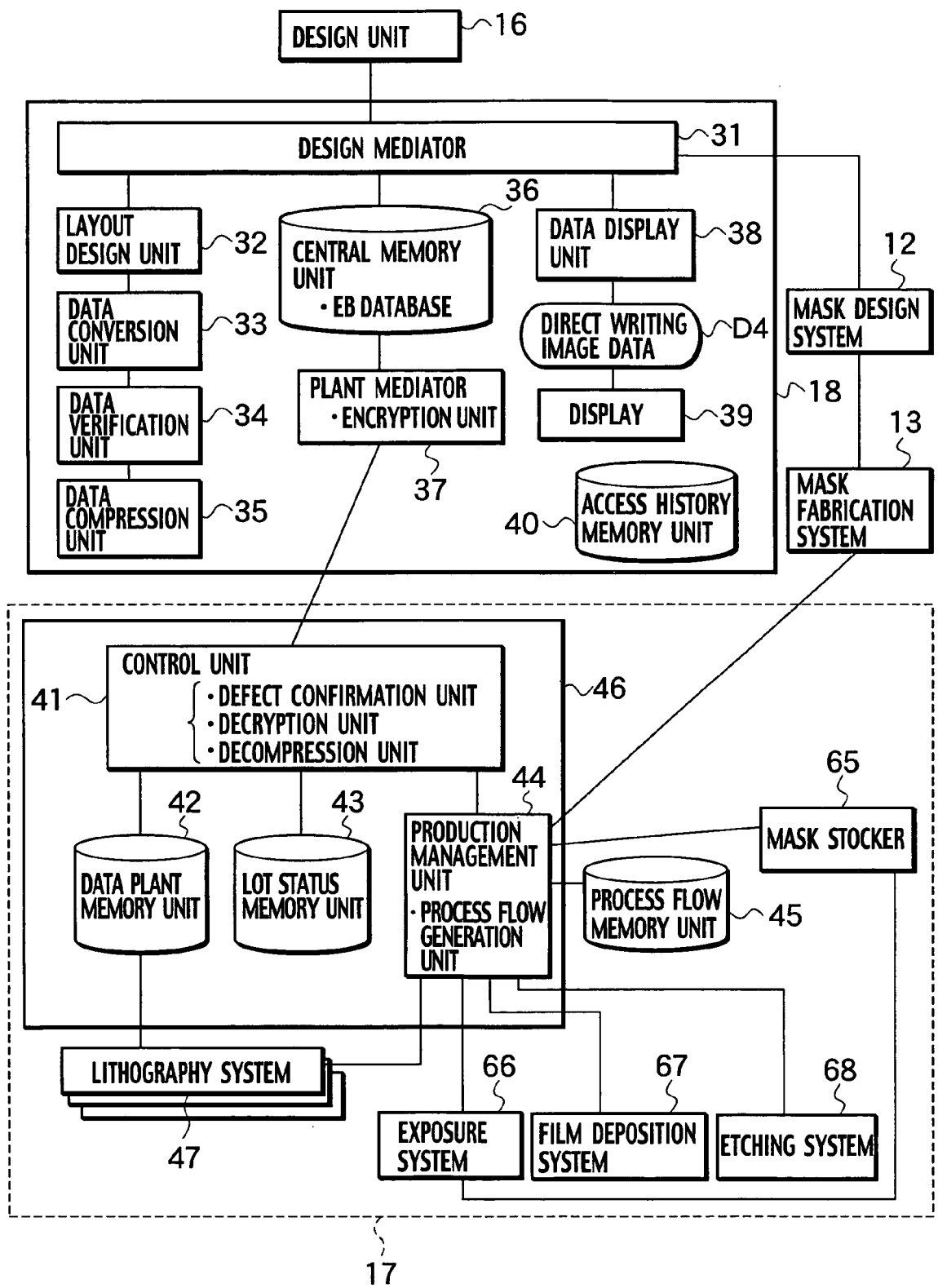
FIG. 9 is a block diagram of a network including the semiconductor device design and fabrication system according to the first embodiment of the present invention.

As shown in FIG. 9, a network including the semiconductor device design and fabrication system 5 includes the design unit 16, the storage system 18, the plant 17, the mask design system 12, and the mask fabrication system 13. The plant 17 includes a mask stocker 65, an exposure device 66, a film deposition device 67, and an etching device 68.

The semiconductor device design and fabrication method of the first embodiment is preferably applicable when a semiconductor device is included in the first lot as a new product, or when a semiconductor device design is refined.

Figure 10:
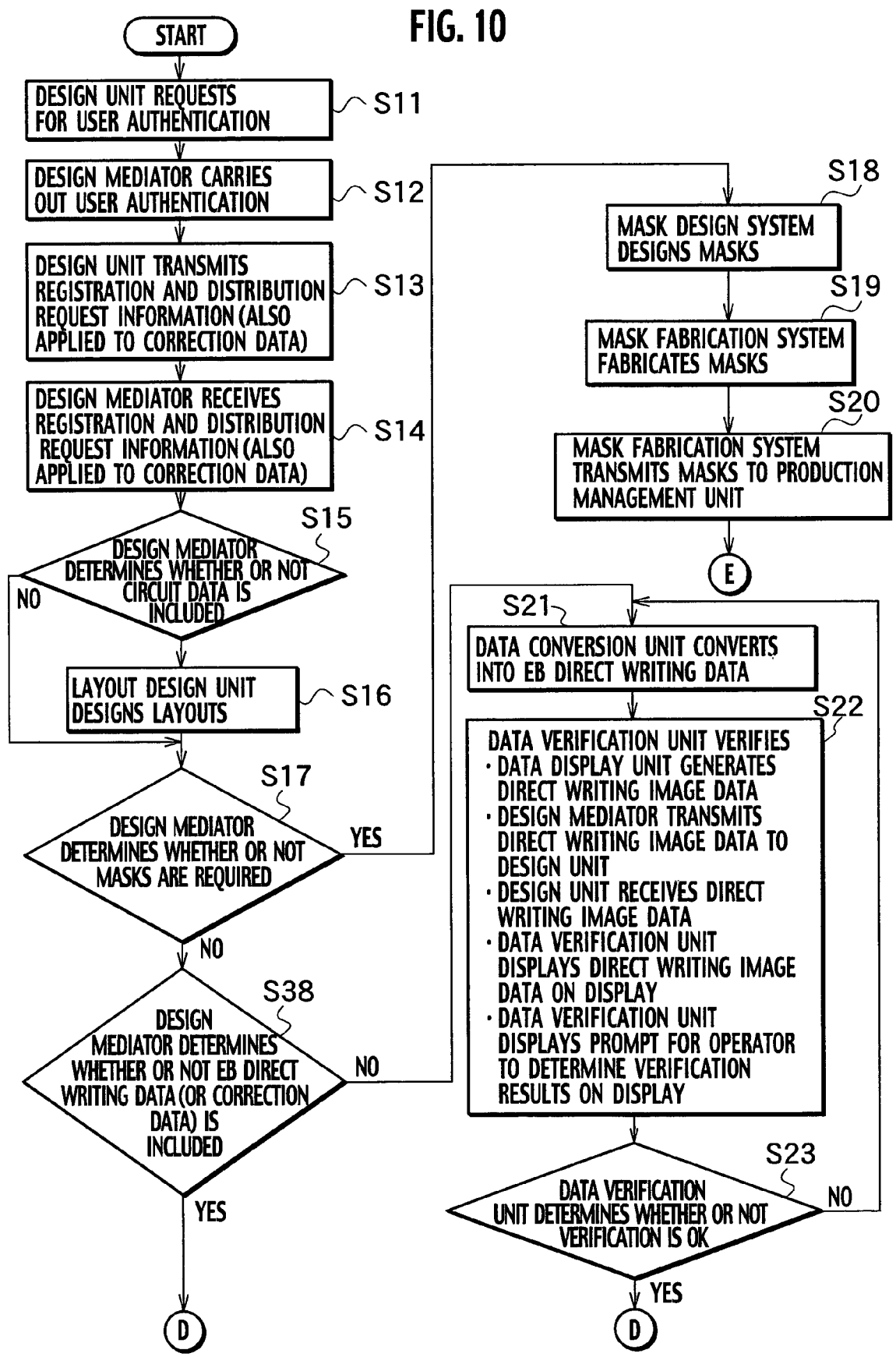
FIGS. 10 and 11 are flowcharts for a semiconductor device fabrication method regarding the semiconductor device design and fabrication method according to the first embodiment of the present invention.
Figure 11:
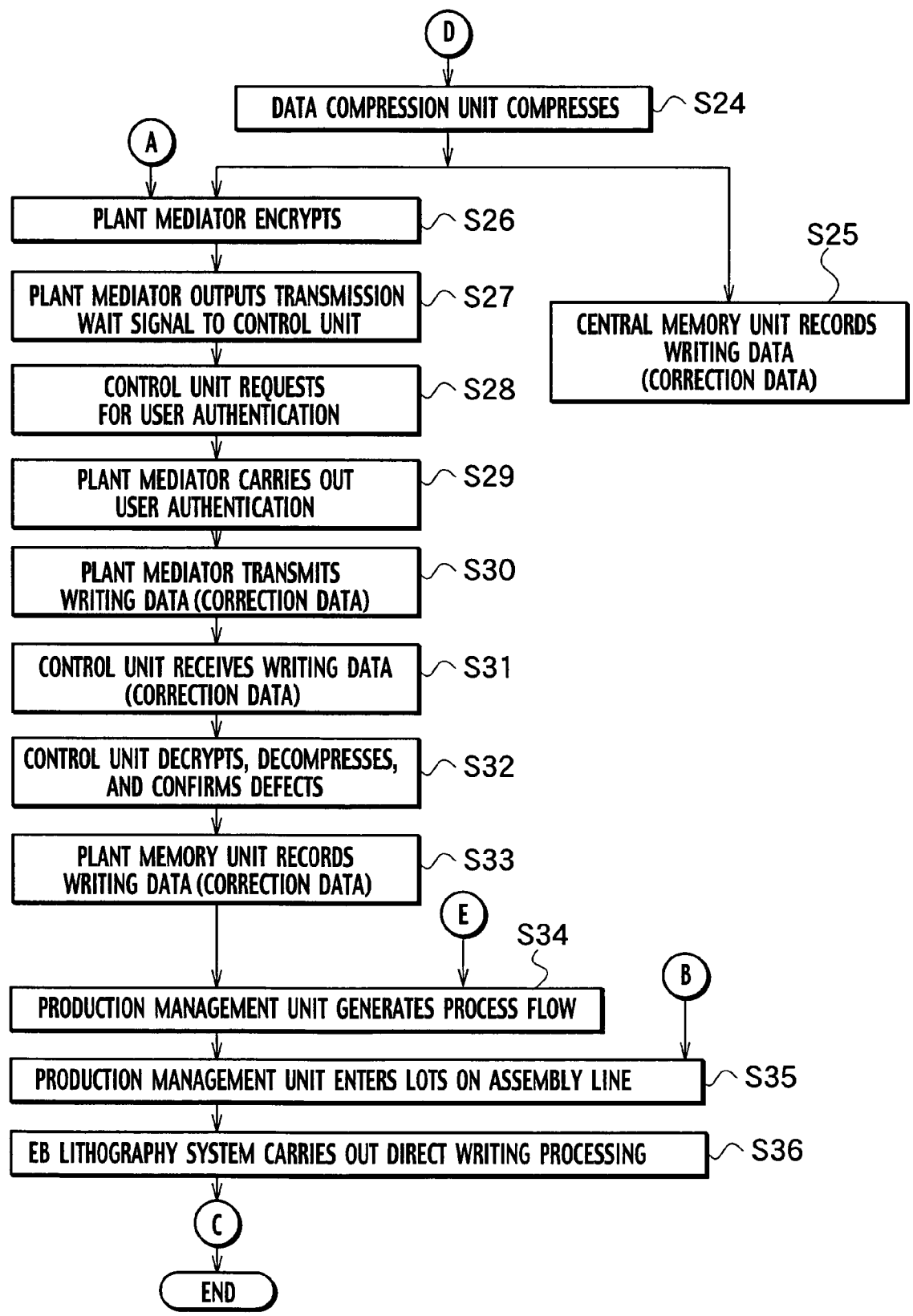

As shown in FIGS. 10 and 11, according to the semiconductor device design and fabrication method of the first embodiment, following usage of the semiconductor device design method of FIG. 8, to begin with, the user authentication unit 60 in FIG. 7 requests the design mediator 31 in FIG. 9 for user authentication in step S11. In step S12, the design mediator 31 carries out user authentication in response to the request. The user authentication unit 60 then confirms that user authentication has been attained.

Figures 12, 13:
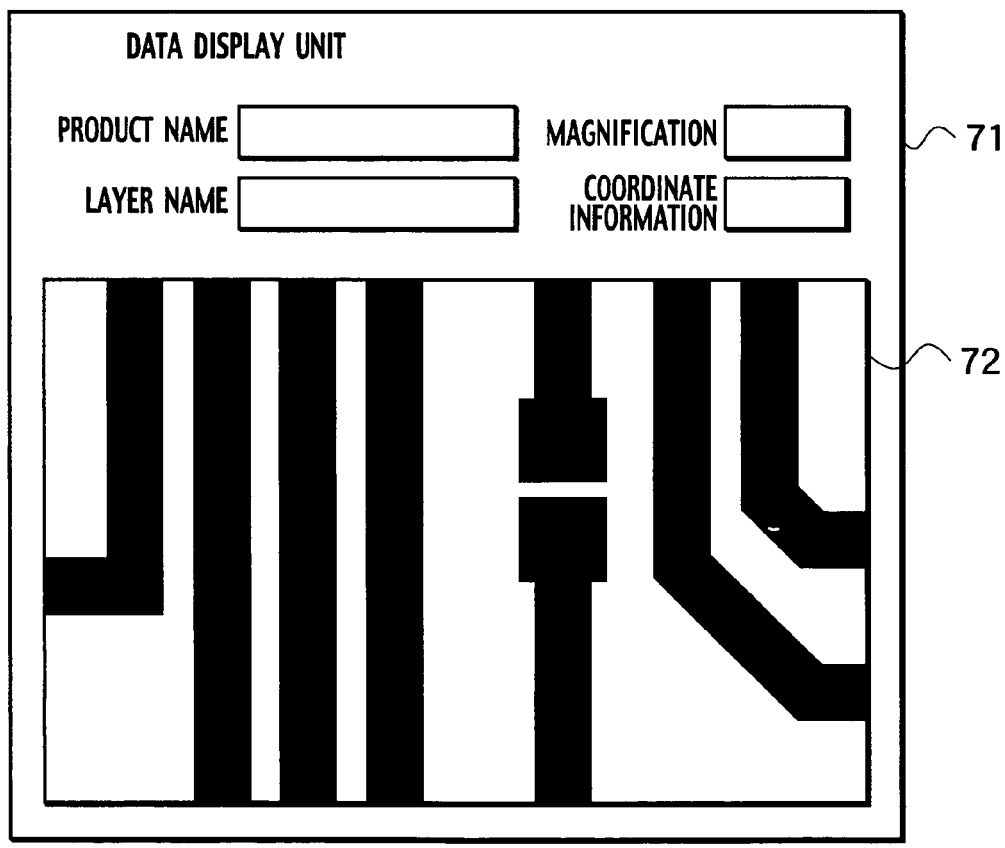
FIG. 12 is a table showing the data structure of writing data registration and distribution request information.
FIG. 13 is an image of writing data displayed on data display unit.

In step S13, the writing data registration and distribution request information generation unit 61 transmits writing data registration and distribution request information D5 to the design mediator 31 via the networks 1 through 4. As shown in FIG. 12, the writing data registration and distribution request information D5 includes the product name of a to-be-fabricated semiconductor device, a layer name to be written through EB direct writing, user information such as the name of one of the design units 8 through 10 or 16 and a delivery date for the semiconductor device, the type of an electron beam lithography system to be used for EB direct writing, the wafer plant name of one of the plants 15, 17, 19, or 20, and a writing data file including writing data D3 corresponding to the product name, the layer name, and the writing device type, and layout data D2 or circuit data D1. In step S14, the design mediator 31 receives the writing data registration and distribution request information D5. As a result, a job of registering and distributing the writing data D3 is registered in the design mediator 31. The design mediator 31 decrypts the writing data D3 and the layout data D2 or the circuit data D1 included in the writing data file.

In step S15, the design mediator 31 determines whether the writing data file including the received writing data registration and distribution request information D5 contains the circuit data D1. If the writing data file contains the circuit data D1, this process proceeds to step S16. Otherwise, if the writing data file does not contain the circuit data D1, this process proceeds to step S17.

In step S16, the layout design unit 32 in the storage system 18 designs a layout of the semiconductor device based on the circuit data D1. The layout design unit 32 outputs the designed layout as layout data D2.

In step S17, the design mediator 31 determines whether masks are required for fabrication of the semiconductor device. If masks are required for fabrication of the semiconductor device, this process proceeds to step S18. Otherwise, if masks are not required for fabrication of the semiconductor device, this process proceeds to step S38.

In step S18, the mask design system 12 designs masks to be used by the exposure device 66 based on the layout data D2. In step S19, the mask fabrication system 13 fabricates the masks. In step S20, the mask fabrication system 13 transmits the masks to the production management unit 44 in the plant 17. The production management unit 44 then stores the masks in the mask stocker 65.

In step S38, the design mediator 31 determines whether the writing data file including the received writing data registration and distribution request information D5 contains the writing data D3. If the writing data file contains the writing data D3, this process proceeds to step S24 of FIG. 11. Otherwise, if the writing data file does not contain the writing data D3, this process proceeds to step S21.

In step S21, the data conversion unit 33 generates the writing data D3 based on the layout data D2. In a process of converting the layout data D2 to the writing data D3, the writing data D3 is converted to a format complying with the writing device type described in the writing data registration and distribution request information D5. The format is selected depending on circumstances, such as software provided by the electron beam lithography system 47, or either manufactured by a third party or manufactured in house.

In step S22, the data verification unit 34 verifies the generated writing data D3. The data verification unit 34 verifies the data D3 by overlapping the layout data D2 with the generated writing data D3. The data display unit 38 converts the writing data D3 to direct writing image data D4. In step S23, the data verification unit 34 determines whether the direct writing image data D4 satisfies a certain EB writing rule. If the direct writing image data D4 satisfies the EB writing rule, this process proceeds to step S24 of FIG. 11. Otherwise, if the direct writing image data D4 does not satisfy the EB writing rule, this process returns to step S21, and repeats conversion to the writing data after investigation of the reason for not satisfying the writing rule and takes countermeasures.

Note that the data verification unit 34 displays the direct writing image data D4 on the display 39. As shown in FIG. 13, the direct writing image data D4 is displayed as a graphic pattern 72 in a window 71 displayed on the display 39. The data verification unit 34 prompts an operator to determine whether the direct writing image data D4 satisfies the EB writing rule. In response, the operator inputs the determination results to the data verification unit 34. The data verification unit 34 determines whether the EB writing rule is satisfied based on this determination results. Alternatively, the design mediator 31 transmits the direct writing image data D4 to the data verification unit 56 via the data reception/transmission unit 62 in the design unit 9. The data verification unit 56 displays the direct writing image data D4 on the display 58 and prompts the operator to determine whether the direct writing image data D4 satisfies the EB writing rule. In response, the operator inputs the determination results to the data verification unit 56. The data reception/transmission unit 62 transmits the determination results to the design mediator 31. The data verification unit 34 determines whether the EB writing rule is satisfied based on this determination result.

In step S24, the data compression unit 35 compresses the writing data D3 so as to save space in a recording medium and reduce the load on the networks 1 through 4. In step S25, the central memory unit 36 records and registers the writing data D3 in the EB database in the central memory unit 36. As shown in FIG. 14, the EB database includes records 77 having a product name field 73, a layer field 74, a writing device type field 75, and an writing data D3 field 76. The central memory unit 36 can extract the writing data D3 specified by the product name, the layer name, and the writing device type. Alternatively, the writing data D3 may be stored with a file name using the product name, the layer name, or the writing device type. Typically, the writing data D3 size is large; therefore, a recording medium with a low bit cost such as a writable DVD may be used. Writing data D3 relevant to a single product name is stored in a single DVD, and that product name and that DVD are associated with each other so that that DVD can be extracted by a DVD auto-changer. This means that the DVD auto-changer is associated with the EB database.

In step S26, the encryption unit in the plant mediator 37 encrypts the writing data D3. Encryption prevents information leakage, information manipulation, or unauthorized information access. In step S27, the plant mediator 37 transmits a transmission wait signal to the control unit 41. In step S28, the control unit 41 requests the plant mediator 37 for user authentication. In step S29, the plant mediator 37 carries out user authentication. In step S30, the plant mediator 37 transmits the writing data D3 to the control unit 41. In step S31, the control unit 41 receives the writing data D3. The writing data D3 is transferred to the plant 15, 17, 19, or 20 corresponding to the wafer plant name included in the writing data registration and distribution request information D5 via the networks 1 through 4. Note that the data is transferred to the wafer plant 15, 17, 19, or 20 in the order in which it is written. In other words, data in an underlying layer is transferred first in order to minimize delay of lots when waiting for the writing data D3. The design mediator 31 and the plant mediator 37 store storage system 18 access logs in the access history memory unit 40. In the case of the design mediator 31, the stored items include the name of a design unit 16, an access time, an accessed service name, and the like for a user. The accessed service includes conversion to the layout data D2, conversion to the writing data D3, verification of the writing data D3, compression of the writing data D3, storage of the writing data D3 in the EB database, and the like. The design mediator 31 calculates a charge for the stored items, charging the design unit 16. On the other hand, in the case of the plant mediator 37, the stored items include the name of plant 17, access times, an accessed service name, and the like for a user. The accessed service denotes reading out the writing data D3 from the EB database. The plant mediator 37 calculates a charge for the stored items, charging the plant 17.

In step S32, the defect confirmation unit in the control unit 41 confirms defects of the writing data D3. In order to prevent data from being defected due to file transfer, confirmation is carried out using a check sum. The decryption unit in the control unit 41 decrypts the writing data D3. The decompression unit in the control unit 41 decompresses the writing data D3.

In step S33, the plant memory unit 42 records the writing data D3 in the EB database of the plant memory unit 42. The EB database of the plant memory unit 42 has the same data structure as the EB database of the central memory unit 36 in FIG. 14. It is desired that an erasable and rewritable recording medium, such as a hard disk or solid-state device memory, be used for the EB database of the plant memory unit 42.

Figure 15:
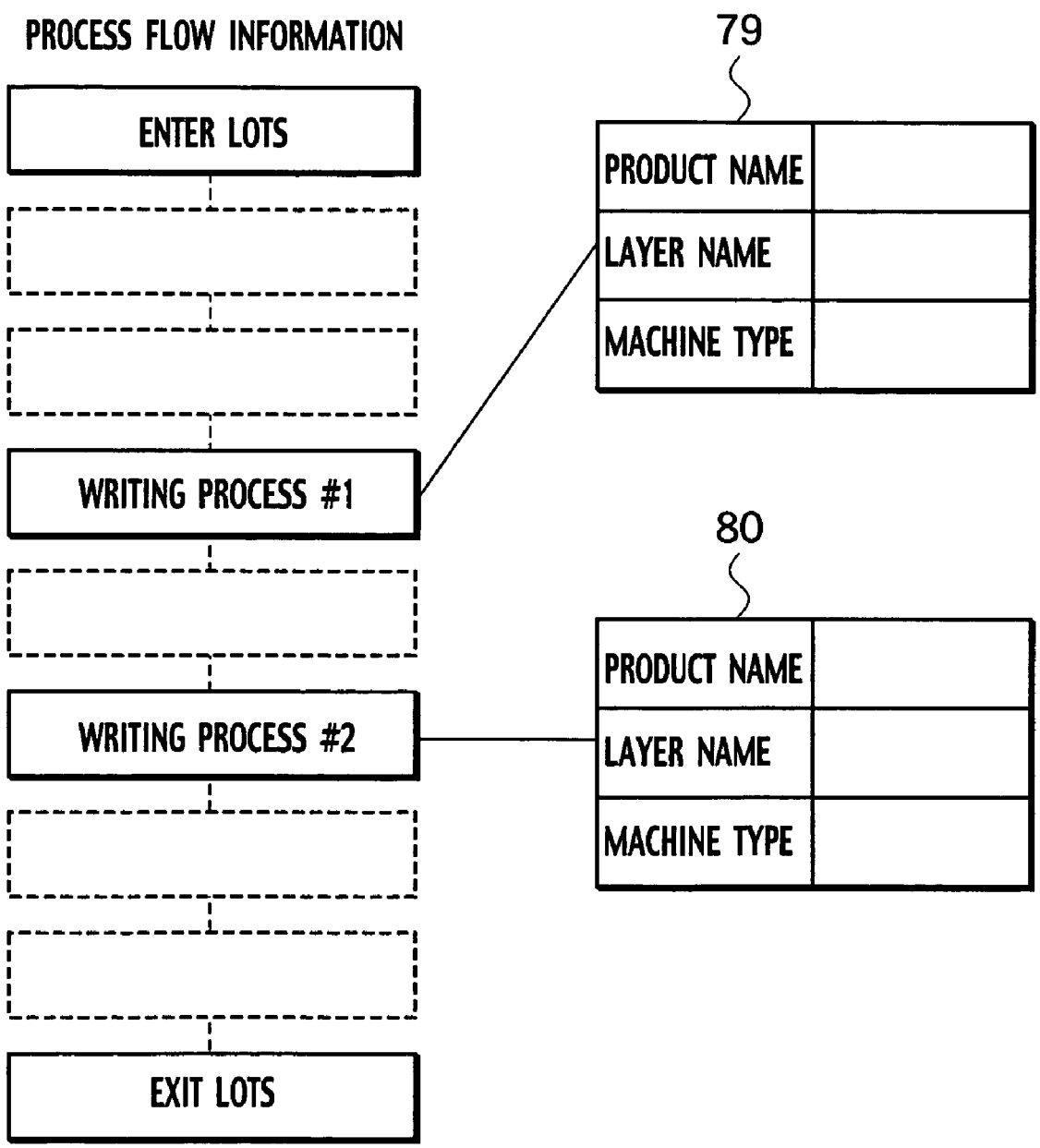
FIG. 15 shows a process flow information of a semiconductor device fabrication process.

In step S34, the process flow generation unit in the production management unit 44 generates a process flow information based on the product name, the layer name, and the writing device type stored in the EB database. The production management unit 44 stores the process flow information in the process flow memory unit 45. The process flow information is generated for each product name. As shown in FIG. 15, a process flow based on the process flow starts with entering a lot on an assembly line, and then carrying out EB writing processes #1 and #2, an exposure process using masks, a film deposition process, and an etching process, and terminates with exiting the resulting products. The EB writing processes #1 and #2 in the process flow information have process condition information 79 and 80, respectively. The product name, the layer name, and the writing device type are specified in the process condition information 79 and 80. The product name, the layer name, and the writing device type in the process condition information 79 and 80 must be the same as the contents of the writing data registration and distribution request information D5 of FIG. 12, which is transmitted from the design unit 8 through 10 or 16.

In step S35, the production management unit 44 enters a lot with a certain product name on an assembly line. The film deposition device 67 deposits a film for that lot according to a process flow information for that product name. The etching device 68 etches the lot according to the process flow information. The exposure device 66 takes a mask from the mask stocker 65 and exposes the lot using that mask according to the process flow information.

In step S36, the electron beam lithography system 47 reads out the product names, the layer names, and the writing device types in the respective process condition information 79 and 80 for the EB writing processes #1 and #2 according to the process flow information. The electron beam lithography system 47 reads out the writing data specified by a product name, a layer name, and a writing device type, from the EB database in the plant memory unit 42. The electron beam lithography system 47 carries out a direct writing process for the lot using the read writing data D3. The electron beam lithography system 47 and the plant memory unit 42 share a network file such as the network file system (NFS). Lastly, the lot with that product name is exited and completed.

The storage system 11, 14, 18, or 21 receives circuit data D1 and layout data D2, or writing data D3 from the design units 8 through 10 and 16 via the networks 1 through 4. The storage system 11, 14, 18, or 21 converts the circuit data D1 or the layout data D2 to the writing data D3. The storage system 11, 14, 18, or 21 stores the writing data D3. The storage system 11, 14, 18, or 21 transfers and distributes the writing data D3 to an arbitrary wafer plant 15, 17, 19, or 20. This process allows the storage system 11, 14, 18, or 21 to centrally control the writing data D3. One of the storage systems 11, 14, 18, and 21 may receive the writing data D3 from the plurality of design units 8 through 10 and 16. One of the storage systems 11, 14, 18, and 21 may transmit the writing data D3 to the plurality of wafer plants 15, 17, 19, and 20. The plurality of wafer plants 15, 17, 19, and 20 can easily acquire the writing data D3 for the same product. The writing data D3 may be stored and acquired from other departments or from other companies.

The semiconductor device design and fabrication system 5, the semiconductor device design system 6, and the semiconductor device fabrication system 7, which include the storage systems 11, 14, 18, or 21, never manually handle the writing data D3. As a result, manpower does not increases. In addition, mistakes due to handling can be reduced.

In the storage systems 11, 14, 18, or 21, the acquired writing data D3 is unconditionally transmitted to the wafer plants 15, 17, 19, or 20 where EB direct writing is carried out using that writing data D3 immediately after acquisition. The plants 15, 17, 19, or 20 can timely acquire the writing data D3 before carrying out EB direct writing.

As described above, according to the first embodiment, a semiconductor device design system that manages writing data to be used for EB direct writing in fabrication of semiconductor devices can be provided. In addition, according to the first embodiment, a semiconductor device fabrication system that manages writing data to be used for EB direct writing in fabrication of the semiconductor devices can be provided.

SECOND EMBODIMENT

A semiconductor device design and fabrication method of a second embodiment is applicable when the same semiconductor devices fabricated in one of the plants 15, 17, 19, and 20 are included in the second or subsequent lot. In other words, the case where the writing data D3 used for the first lot is erased from the plant memory unit 42 is considered. This is because the capacity of the plant memory unit 42 may be small. A semiconductor device design and fabrication system 5, a semiconductor device design system 6, and a semiconductor device fabrication system 7 of the second embodiment have the same structures as those of the first embodiment, respectively.

Figure 16:
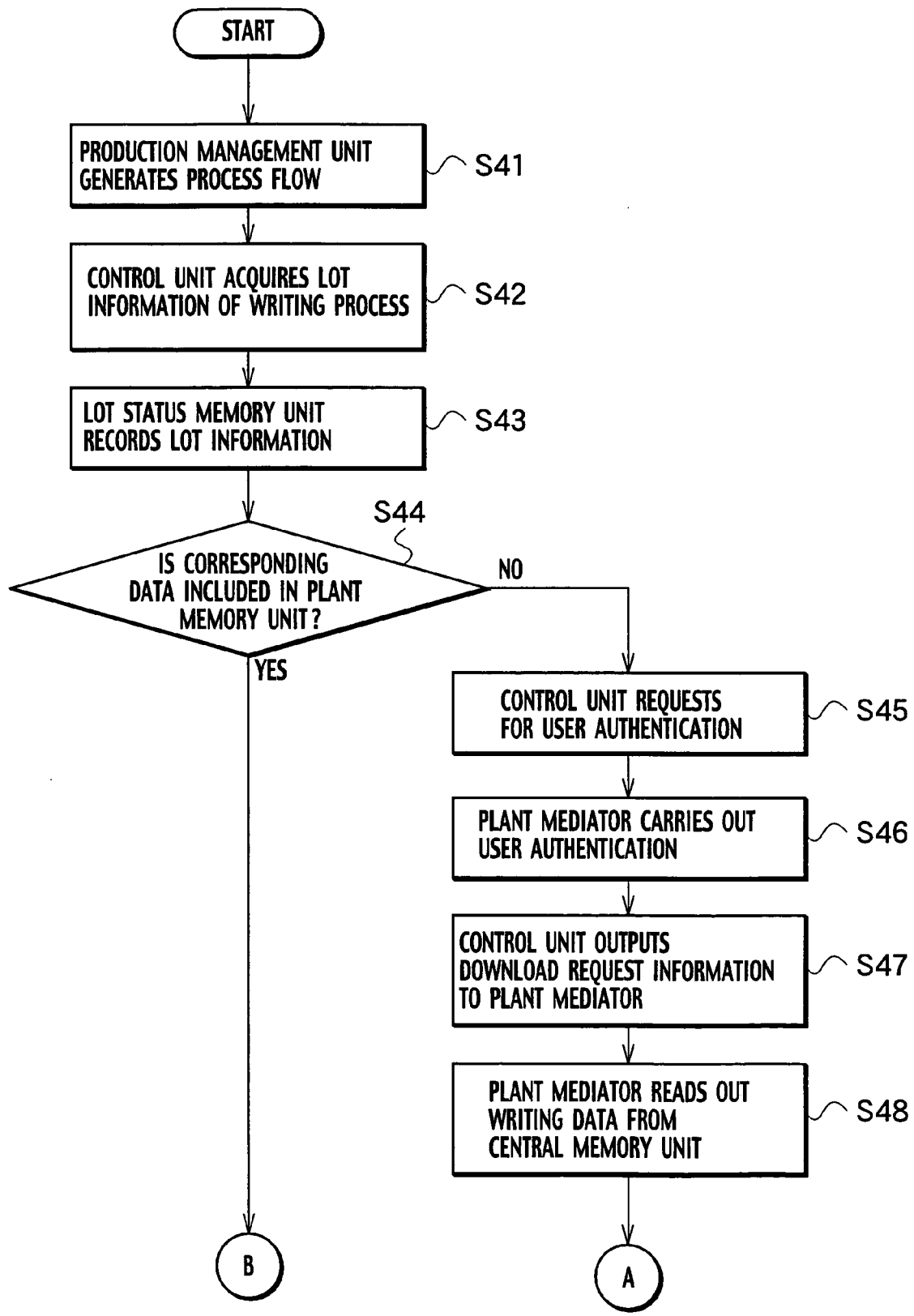
FIG. 16 is a flowchart for a semiconductor device fabrication method regarding a semiconductor device design and fabrication method according to a second embodiment of the present invention.

As shown in FIG. 16, according to the semiconductor device design and fabrication method of the second embodiment, to begin with, the production management unit 44 in the plants 15, 17, 19, and 20 generates a process flow information in step S41. The production management unit 44 registers the process flow information of FIG. 15 in the process flow memory unit 45. This operation may be implemented in the case of using not only EB direct writing, but also photo masks. When the process flow based on the process flow information is completed, lots actually enter assembly lines in the plants 15, 17, 19, and 20. In step S42, the control unit 41 acquires EB lot information including the EB direct writing process. As shown in FIG. 17, EB lot information includes a product name, a layer name, a writing device type, a lot number, an access time, and a removability flag. When multiple EB writing processes are included in the process flow, the EB lot information can be acquired for each writing process. The EB lot information includes records 87 made up of a product name field 81, a layer name field 82, a writing device type field 83, a lot number field 84, an access time field 85, and a removability flag field 86. The control unit 41 can extract from the lot status memory unit 43 a product name for which writing data D3 can be removed based on the access time and the removability flag.

In step S43, the lot status memory unit 43 stores and registers the acquired EB lot information. Note that the registered time is written in the access time field, and 'No' is written in the removability flag field.

In step S44, the control unit 41 determines whether there is writing data D3, which is associated with the EB lot information: the product name, the layer name, and the writing device type, in the plant memory unit 42. If there is, this means that the necessary writing data D3 exists, and thus this process proceeds to step S35 or step S36 in FIG. 11. If not, this process proceeds to step S45.

In step S45, the control unit 41 requests the plant mediator 37 for user authentication. In step S46, the plant mediator 37 carries out user authentication. In step S47, the control unit 41 outputs EB data download request information to the plant mediator 37. As shown in FIG. 18, the EB data download request information includes the product name of a semiconductor device to be fabricated in the plant 17 or the like, a layer name to be written through EB direct writing, user information such as a delivery date for the semiconductor device, the type of writing device of an electron beam lithography system to be used for EB direct writing, and a wafer plant name of, for example, plant 17.

In step S48, the plant mediator 37 acquires, from the central memory unit 36, writing data D3 corresponding to the product name, the layer name, and the writing device type in the EB data download request information. This process then proceeds to step S26 in FIG. 11. Processes after step S26 are the same as those of the first embodiment.

According to the semiconductor device design and fabrication method of the second embodiment, when a lot needing the EB direct writing process enters an assembly line in a wafer plant, the control unit 41 issues a download request for the writing data D3 to the plant mediator 37 so that the plant memory unit 42 can download the writing data D3 prior to EB direct writing. In this way, in response to the download request from the plant 15, 17, 19, or 20, the storage system 11, 14, 18, or 21 distributes the writing data D3 to the plant 15, 17, 19, or 20 from which the request is issued. Therefore, the writing data D3 for the semiconductor device need not be maintained in the plant 15, 17, 19, or 20, even if that data will be used again for a lot entering an assembly line in the plant 15, 17, 19, or 20. Since the writing data D3 size is large and may not be retained, the load on the system resources may be reduced.

As described above, according to the second embodiment, a semiconductor device design system that manages writing data to be used for EB direct writing in fabrication of the semiconductor devices can be provided. In addition, according to the second embodiment, a semiconductor device fabrication system that manages writing data to be used for EB direct writing in fabrication of the semiconductor devices can be provided.

THIRD EMBODIMENT

With a semiconductor device design and fabrication method of a third embodiment, less frequently used writing data D3 is removed from the plant memory unit 42 in the plant 15, 17, 19, or 20. This prevents system resources from accumulatively increasing in each of wafer plants 15, 17, 19, and 20 even if the writing data D3 file size is large. When the removed writing data D3 is needed, the writing data D3 can be downloaded according to the semiconductor device design and fabrication method of the second embodiment. A semiconductor device design and fabrication system 5, a semiconductor device design system 6, and a semiconductor device fabrication system 7 of the third embodiment have the same structures as those of the first embodiment, respectively.

Figure 19:
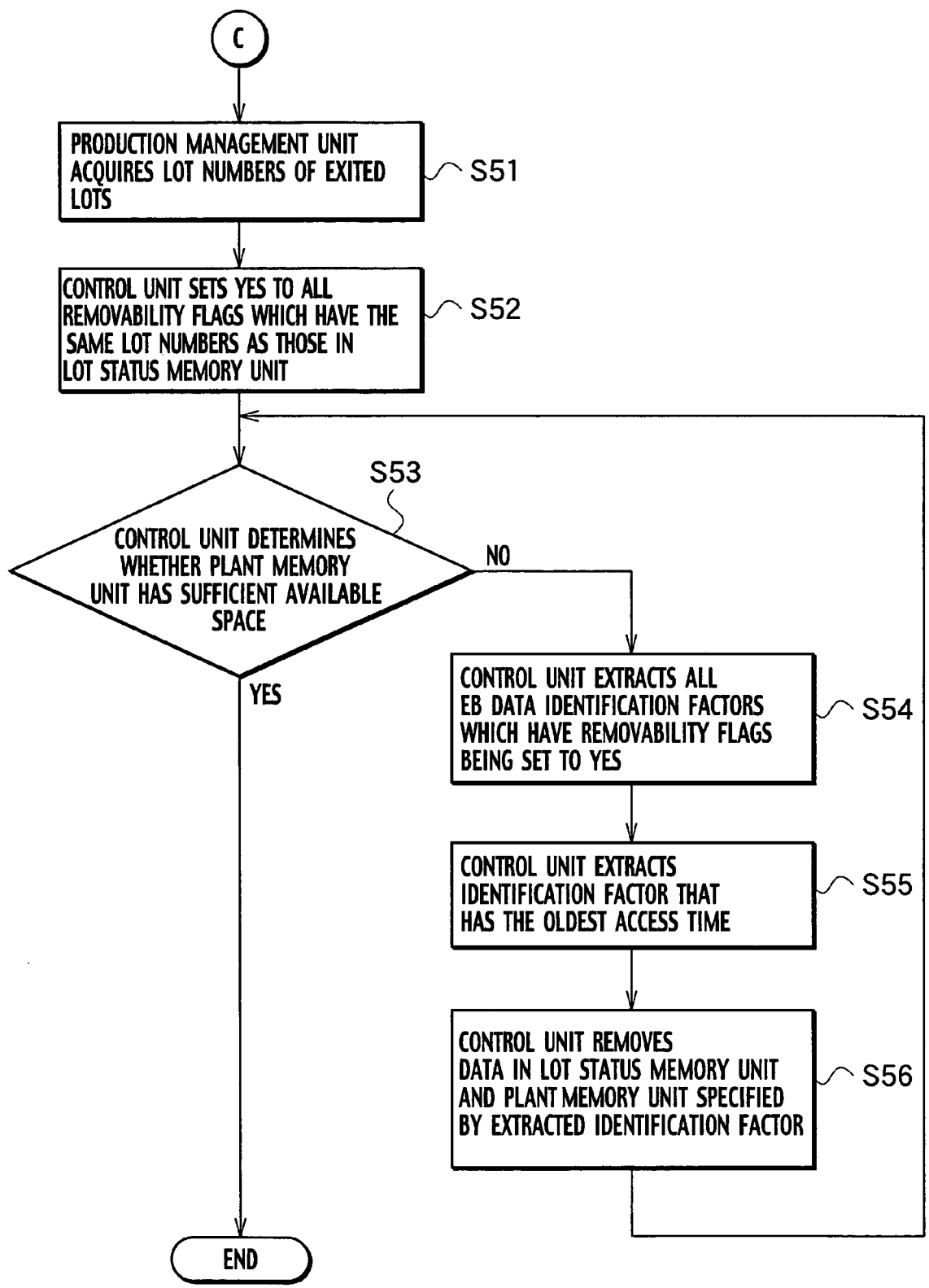
FIG. 19 is a flowchart for a semiconductor device fabrication method regarding a semiconductor device design and fabrication method according to a third embodiment of the present invention.

As shown in FIG. 19, according to the semiconductor device design and fabrication method of the third embodiment, in step S51 following step S36 of FIG. 11, the production management unit 44 recognizes that lots Lot A through Lot E, which need more than one EB direct writing process, are completed and exited. The product names: 'product A' and 'product B', and the lot numbers: 'Lot A' through 'Lot E' of those exited lots are then acquired. In addition, the exit time for each of lots Lot A through Lot E is acquired.

In step S52, as shown in FIG. 20, the control unit 41 sets 'Yes' to all removability flag fields 86 in the records 88 through 97 for the same lot numbers as lot numbers 'Lot A' through 'Lot E' acquired by the lot status memory unit 43. The control unit 41 inputs the acquired and exited times in the respective access time fields 85 of the records 88 through 97 for the same lot numbers as lot numbers 'Lot A' through 'Lot E' acquired by the lot status memory unit 43.

In step S53, the control unit 41 checks and determines whether the plant memory unit 42 has sufficient available space. The basis for determination of whether the available space is sufficient is, for example, if the available space is 10% or less of the entire capacity, or if the available space is 1 GB or less. If the available space is sufficient, this process using the semiconductor device design and fabrication method of the third embodiment is over. Otherwise, if the available space is insufficient, this process proceeds to step S54.

In step S54, the control unit 41 extracts EB data identification factors having all removability flags 'Yes'. The EB data identification factors include a product name, a layer name, and the type of writing device. More specifically, (product A, M1, E1), (product A, M2, E1), (product B, M1, E2), and (product B, M2, E2) can be extracted as groups of (product name, layer name, writing device type).

In step S55, when multiple groups of (product name, layer name, writing device type) are found, the control unit 41 extracts the group with the oldest access time. More specifically, the last access time of the group (product A, M1, E1) is October, 2003; that of the group (product A, M2, E1) is October, 2003; that of the group (product B, M1, E2) is December, 2002; and that of the group (product B, M2, E2) is December, 2002. As a result, the groups (product B, M1, E2) and (product B, M2, E2) with the last access time of December, 2002 are groups with the oldest access time.

In step S56, the control unit 41 removes the record 77 in FIG. 14 including the writing data D3 in the EB database of the plant memory unit 42, specified by the extracted groups of (product name, layer name, writing device type). In addition, the control unit 41 removes the records 94 through 97 of the EB lot information of FIG. 20 in the lot status memory unit 43, specified by the extracted groups of (product name, layer name, and writing device type). This process returns to step S53, and the process loop from steps S53 to S56 is repeated until sufficient space is available. However, if the available space is still insufficient even if there is no removable data, the available space in the recording medium of the plant memory unit 42 must be expanded.

According to the semiconductor device design and fabrication method of the third embodiment, each of the wafer plants 15, 17, 19, and 20 does not have to store the writing data D3 for a long term, resulting in reduction in costs of equipment and maintenance.

As described above, according to the third embodiment, a semiconductor device design system is provided that manages writing data to be used for EB direct writing in fabrication of the semiconductor devices. In addition, according to the third embodiment, a semiconductor device fabrication system is provided that manages writing data to be used for EB direct writing in fabrication of the semiconductor devices.

FOURTH EMBODIMENT

According to a semiconductor device design and fabrication method of a fourth embodiment, not only writing data D3, but also proximity effect correction data are used. A semiconductor device design and fabrication system 5, a semiconductor device design system 6, and a semiconductor device fabrication system 7 of the fourth embodiment have the same structures as those of the first embodiment, respectively.

Proximity effect is a phenomenon in which the amount of energy given to a pattern substantially increases due to scattered beams from an underlying layer such as a semiconductor device substrate during EB direct writing. In particular, when patterns are closely and densely deployed, the size becomes larger than that of an isolated pattern. Proximity effect correction is carried out to correct the amount of exposure at each position such that the amount of accumulated energy within the beam-exposed region can be almost constant. Proximity effect correction data represents a to-be-irradiated region requiring exposure correction.

The correction data is generated based on a correction model using the writing data D3 for a to-be-corrected layer and the writing data D3 for an underlying layer. For example, as shown in FIG. 21, to begin with, a logic sum of pieces of writing image data 101 and 102 of the writing data D3 for the underlying layers A and B is calculated. Writing image data 104 is generated from the logic sum. The logic product of the writing image data 103 and the writing image data 104 of the writing data D3 for a to-be-corrected layer C is then calculated. Writing image data 105 or correction data is generated from the logic product. The correction data is generated based on the writing image data 105. The exemplary correction model is represented by the logic expression of Expression 1.

Correction data (layer $C$)=(writing data (layer $A$)+writing data (layer $B$))*writing data (layer $C$)     (1)

where, +denotes a logic sum, and * denotes a logic product.

The correction data is always used with the writing data D3 when performing EB direct writing, and is considered as dependent data to the writing data D3. However, according to the semiconductor device design and fabrication method of the fourth embodiment, the correction data is treated the same as the writing data D3. The correction data is generated for an apparently different layer than the writing data D3, and a single record 77 is provided for correction data. This allows storage and management of the correction data as well as the writing data D3 by somewhat modifying the semiconductor device design and fabrication method described in the first through the third embodiment.

A modification of the first embodiment is that besides the writing data registration and distribution request information D5, the EB correction data generation, registration, and distribution request information is additionally included in data received from the design unit 16 or the like in step S13 of FIG. 10. As shown in FIG. 22, the EB correction data generation, registration, and distribution request information includes a product name, a to-be-corrected layer name, a correction model, user information, the type of writing device, and a wafer plant name. The writing data registration and distribution request information D5 is changed or corrected by the EB correction data generation, registration, and distribution request information. The writing data registration and distribution request information D5 and the EB correction data generation, registration, and distribution request information include the same product name, user information, the type of writing device, and wafer plant name if both are to be used for the change or correction. A hypothetical name different from the layer name in the writing data registration and distribution request information D5 can be assigned to the to-be-corrected layer name. This allows generation of the record 77 for correction data in the EB database of FIG. 14. The correction data has the same format as the writing data D3. The electron beam lithography system 47 determines an electron beam irradiation pattern based on the writing data D3. The electron beam lithography system 47 changes electron beam irradiation intensity based on the correction data.

The data conversion unit 33 generates correction data when converting to the writing data D3 in step S21. Necessary writing image groups 101 through 103 are acquired from the central memory unit 36 based on the correction model in the EB correction data generation, registration, and distribution request information. Note that the correction model is not limited to the algorithm of generating the correction data in FIG. 21. Alternatively, each correction model may have a unique parameter.

As shown in FIG. 23, a layer name for correction is added to a process condition information 107 for an EB writing process #1 when generating a process flow information in step S34. This layer name for correction should be the same as the to-be-corrected layer name in the EB correction data generation, registration, and distribution request information.

A modification of the second and the third embodiment is that as shown in FIG. 24, a layer name field 108 for correction data is generated when recording EB lot information in step S43 of FIG. 16. When determining whether the target data is in step S44 in the plant memory unit 42, the presence of correction data is also determined. This allows management of the correction data.

As described above, according to the fourth embodiment, a semiconductor device design system that manages writing data to be used for EB direct writing in fabrication of the semiconductor devices can be provided. In addition, according to the fourth embodiment, a semiconductor device fabrication system that manages writing data to be used for EB direct writing in fabrication of the semiconductor devices can be provided.

FIFTH EMBODIMENT

A fifth embodiment is related to the central memory unit 36 in FIG. 9, for example, according to the first embodiment and central memory unit 36 in step S25 of FIG. 11, which store writing data D3, and the fifth embodiment is also related to the plant mediator 37 which reads out the writing data D3 from the central memory unit 36 in step S48 of FIG. 16 of the second embodiment.

Figure 25:
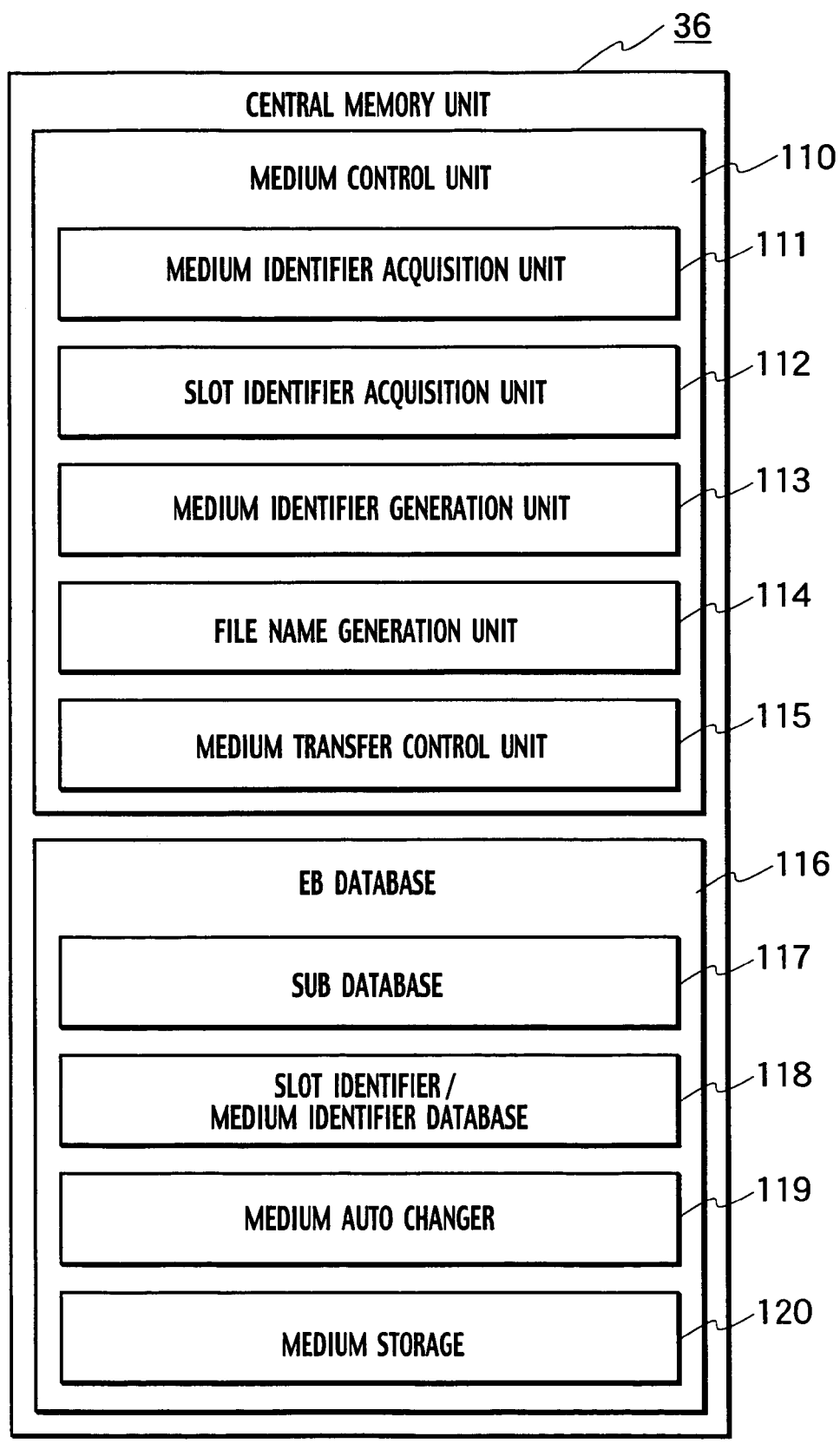
FIG. 25 is a block diagram of a central memory unit in a semiconductor device design and fabrication system according to a fifth embodiment of the present invention.

As shown in FIG. 25, the central memory unit 36 includes a medium control unit 110 and an EB database 116. The medium control unit 110 includes a medium identifier acquisition unit 111, a slot identifier acquisition unit 112, a medium identifier generation unit 113, a file name generation unit 114, and a medium transfer control unit 115. The EB database 116 includes a sub EB database 117, a slot identifier/recording medium identifier database 118, a recording medium auto changer 119, and a medium storage unit 120.

Figure 26:
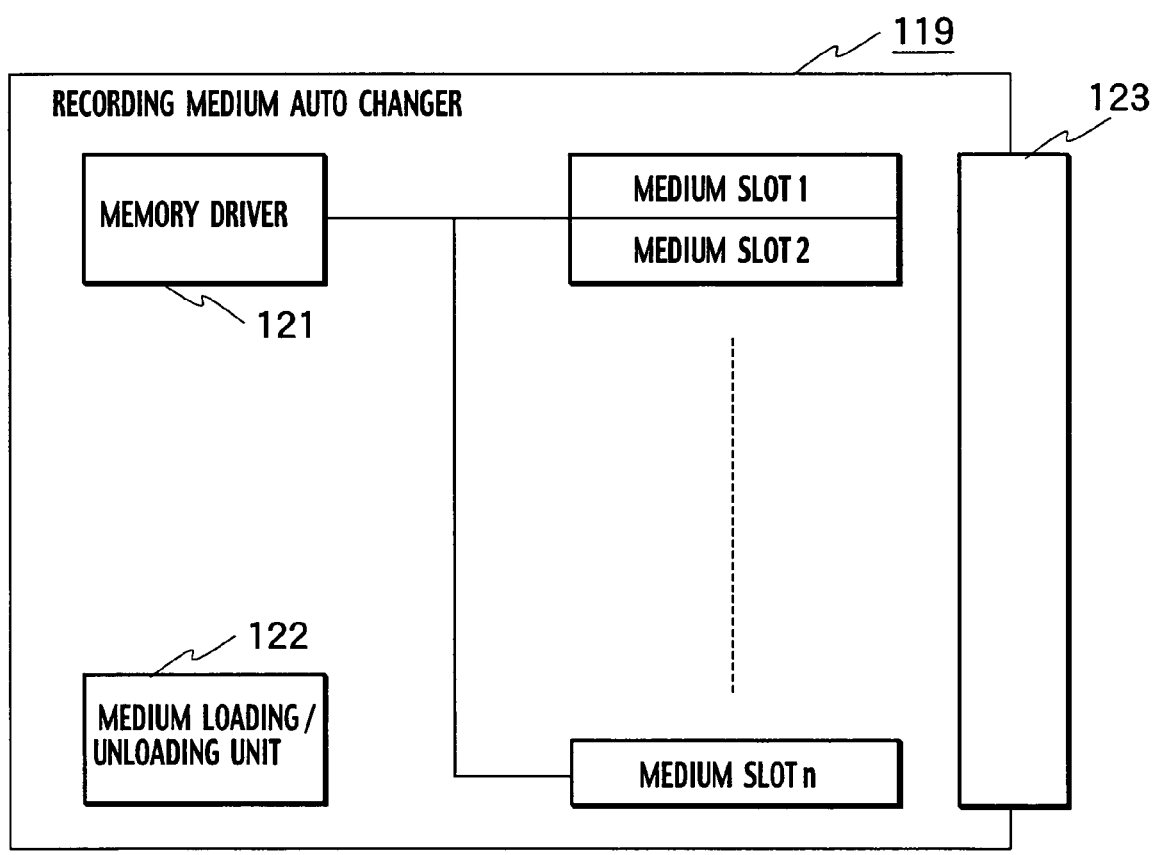
FIG. 26 is a block diagram of a DVD auto changer in the central memory unit.
Figure 27:
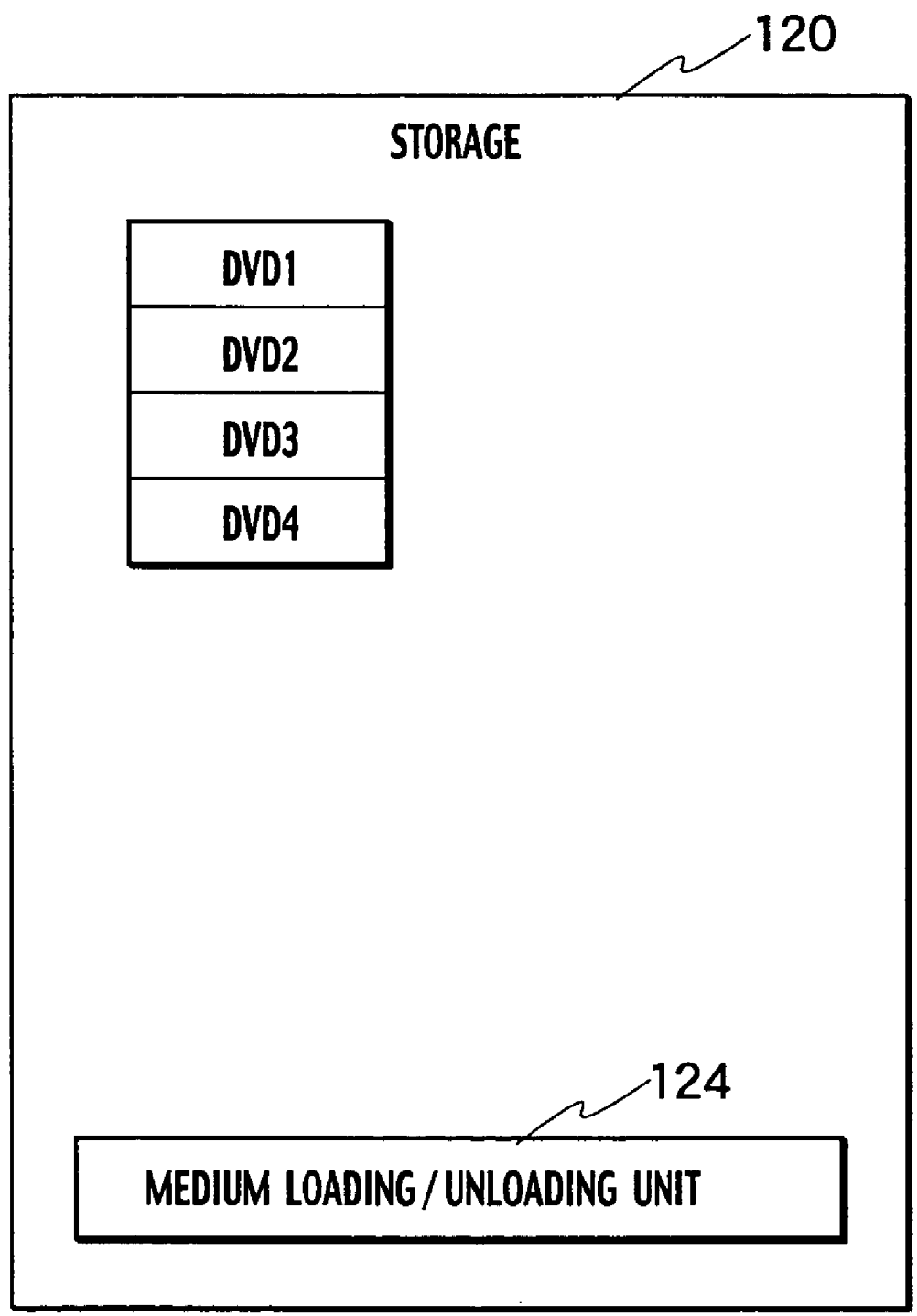
FIG. 27 is a block diagram of a DVD storage unit in the central memory unit.

As shown in FIG. 26, the recording medium auto changer 119 includes a recording medium drive 121, a medium loading/unloading unit 122, recording medium slots 1 through n, and a recording medium ejector 123. There are multiple slots 1 through n, which allow ejection and insertion of recording media. The slots 1 through n can be specified by the slot identifiers, respectively. As shown in FIG. 27, the medium storage unit 120 includes a medium loading/unloading unit 124. Note that the recording media DVDs 1 through 4 are assumed to be DVDs; however, the recording medium is not limited to DVDs, and may be any kind of nonvolatile memory, which should be selected considering bit cost. More specifically, EEPROM, SRAM, magnetic memory disks, or optical memory disks including DVDs may be used instead of the recording media DVDs 1 through 4.

Figure 28:
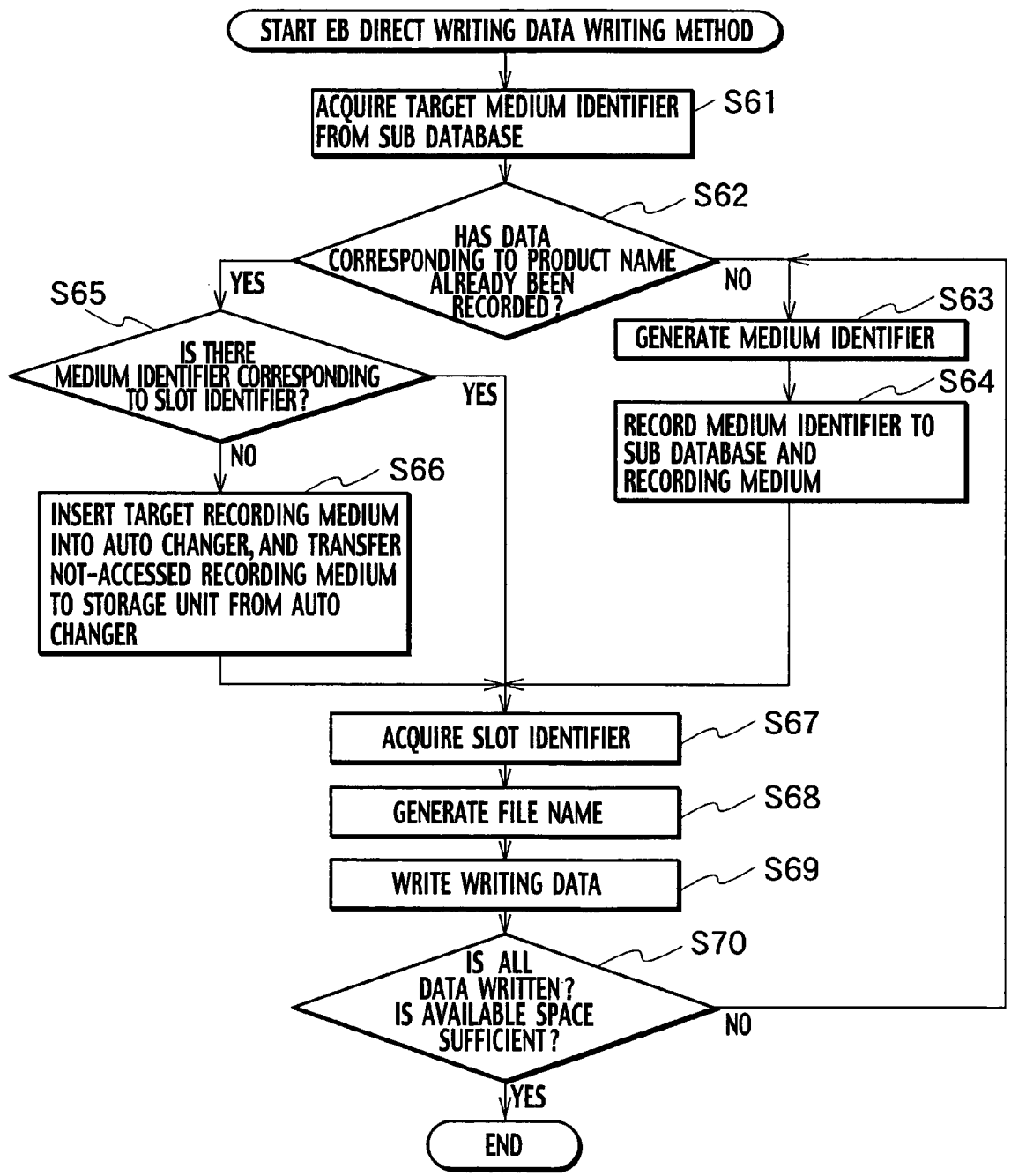
FIG. 28 is a flowchart for a method of writing a writing data stored in the central memory unit.

Next, storing the writing data in the central memory unit 36 in step S25 of FIG. 11 of the first embodiment is carried out using a writing data writing method as shown in FIG. 28. It is considered that the central memory unit 36 is in a state capable of receiving the writing data D3, and the product name, the layer name, and the writing device type, which are associated with the writing data D3.

To begin with, in step S61, the medium identifier acquisition unit 111 acquires a medium identifier specified by the product name based on the sub EB database 117. In addition, the medium identifier acquisition unit 111 acquires a file name, which can be specified by the product name, the layer name, and the writing device type based on the sub EB database 117. As shown in FIG. 30, the sub EB database 117 includes records 129. Each record 129 includes a product name field 73, a layer name field 74, a writing device type field 75, a recording medium identifier field or a file name field 126, a latest access time field 127, and a field 128 indicating the location as either the slots 1 through n or the storage unit 120.

In step S62, the medium identifier acquisition unit 111 determines whether the medium identifier specified by the product name has already been recorded in the sub EB database 117. If not recorded yet, this process proceeds to step S63; otherwise, if already recorded, this process proceeds to step S65.

In step S63, the medium identifier generation unit 113 generates a new medium identifier based on the product name, the layer name, and the writing device type. In addition, in step S64, the medium identifier generation unit 113 generates in the sub EB database 117 a record 129, which allows identification of that new medium identifier from the product name, the layer name, and the writing device type.

In step S64, the medium loading/unloading unit 122 loads a new recording medium into the recording medium drive 121. The medium identifier generation unit 113 records a new medium identifier in that new recording medium. The medium identifier generation unit 113 extracts a slot identifier for a slot in which no recording medium is inserted, and which allows insertion of a recording medium on which a medium identifier is recorded. As shown in FIG. 31, the medium identifier generation unit 113 generates records 133, which allows identification of a slot identifier for a recording medium inserted in the slot from a recording medium identifier, in the slot identifier/recording medium identifier database 118. The records 133, which are generated in the slot identifier/recording medium identifier database 118, include a slot identifier field 131 and a recording medium identifier field 132, respectively. This process proceeds to step S67.

Proceeding to step S65, the slot identifier acquisition unit 112 determines whether there is a slot identifier corresponding to the medium identifier based on the slot identifier/recording medium identifier database 118. If there is a slot identifier corresponding to the medium identifier, this process proceeds to step S67. Otherwise, if there is no slot identifier corresponding to the medium identifier, this process proceeds to step S66. If there is no slot identifier corresponding to the medium identifier, a recording medium corresponding to the medium identifier is stored in the storage unit 120. In the storage unit 120, the medium loading/unloading units 122 and 124 load and unload the recording media DVDs 1 through 4 into/from the slots 1 through n.

In step S66, the medium transfer control unit 115 stores an access time in the field 127 when the writing data D3 is written, and an updated access time whenever the writing data D3 is read out. These access times are associated with a product name, a layer name, and a writing device type, forming records 129. The medium transfer control unit 115 selects the last access time for each recording medium. The medium transfer control unit 115 extracts the medium identifier for the recording medium with the oldest access time from multiple recording media loaded in the slots. The medium loading/unloading units 122 and 124 unload a recording medium specified by the extracted medium identifier to the storage unit 120 from the slots 1 through n. The medium loading/unloading units 122 and 124 load the recording media DVDs 1 through 4 specified by the medium identifier acquired in step S61 into available slot 1 through n from the storage unit 120. The medium transfer control unit 115 changes medium identifiers corresponding to the slot identifiers for the slots 1 through n in which the recording media DVDs 1 through 4 have been replaced in the slot identifier/recording medium identifier database 118. The medium transfer control unit 115 stores, in the field 128, an identifier that identifies in which of a slot or the storage unit 120 a recording medium is stored. The identifiers that identify in which of the slots 1 through n or the storage unit 120 the recording media are stored are associated with a product name, a layer name, and a writing device type, forming the records 129. The determination in step S65 may be carried out using the field 128.

Even if the number of slots is limited, and the number of recording media that can be stored in the auto-changer 119 is limited, the number of recordable recording media can be increased by transferring the recording media to the storage unit 120 in an increasing order of access time. Even if the auto changer 119 does not include the recording media DVDs 1 through 4 in which writing data is recorded, but includes the data in the storage unit 120, retrieving the writing data D3 with the same product name together in the recording media DVDs 1 through 4 and then recording the data is possible.

In step S67, the slot identifier acquisition unit 112 acquires a slot identifier from the medium identifier based on the slot identifier/recording medium identifier database 118.

In step S68, the file name generation unit 114 generates a file name, which can be specified by the product name, the layer name, and the writing device type.

In step S69, the recording medium drive 121 records the generated file name and the writing data that is specified by a product name, a layer name, and a writing device type, on the recording medium specified by the acquired slot identifier based on the slot identifier/recording medium identifier database 118. The writing data recorded together with the file name can be read out by specifying that file name.

In step S70, the recording medium drive 121 determines whether all writing data is recorded, and whether there is a shortage of available space in the recording media DVDs 1 through 4. If all data cannot be recorded due to insufficient available space, this process returns to step S63. Otherwise, if all data can be recorded since the available space is sufficient, this process using the writing data writing method is over. This allows recording of multiple pieces of writing data D3 on a single recording medium. Alternatively, a single piece of writing data D3 can be divided and recorded on the multiple recording media. More specifically, as shown in FIGS. 32A and 32B, multiple pieces of writing data DEV01_LAYER1_EQ1, DEV01_LAYER2_EQ1, and DEV01_LAYER3_EQ1 are recorded on a DVD disc with a disc ID 00001. Multiple pieces of writing data DEV01_LAYER3_EQ1 and DEV01_LAYER4_EQ1 are recorded on a DVD disc with a disc ID 00002. Alternatively, the writing data DEV01_LAYER3_EQ1 may be divided and recorded on two DVD discs with the disc IDs 00001 and 00002.

Figure 29:
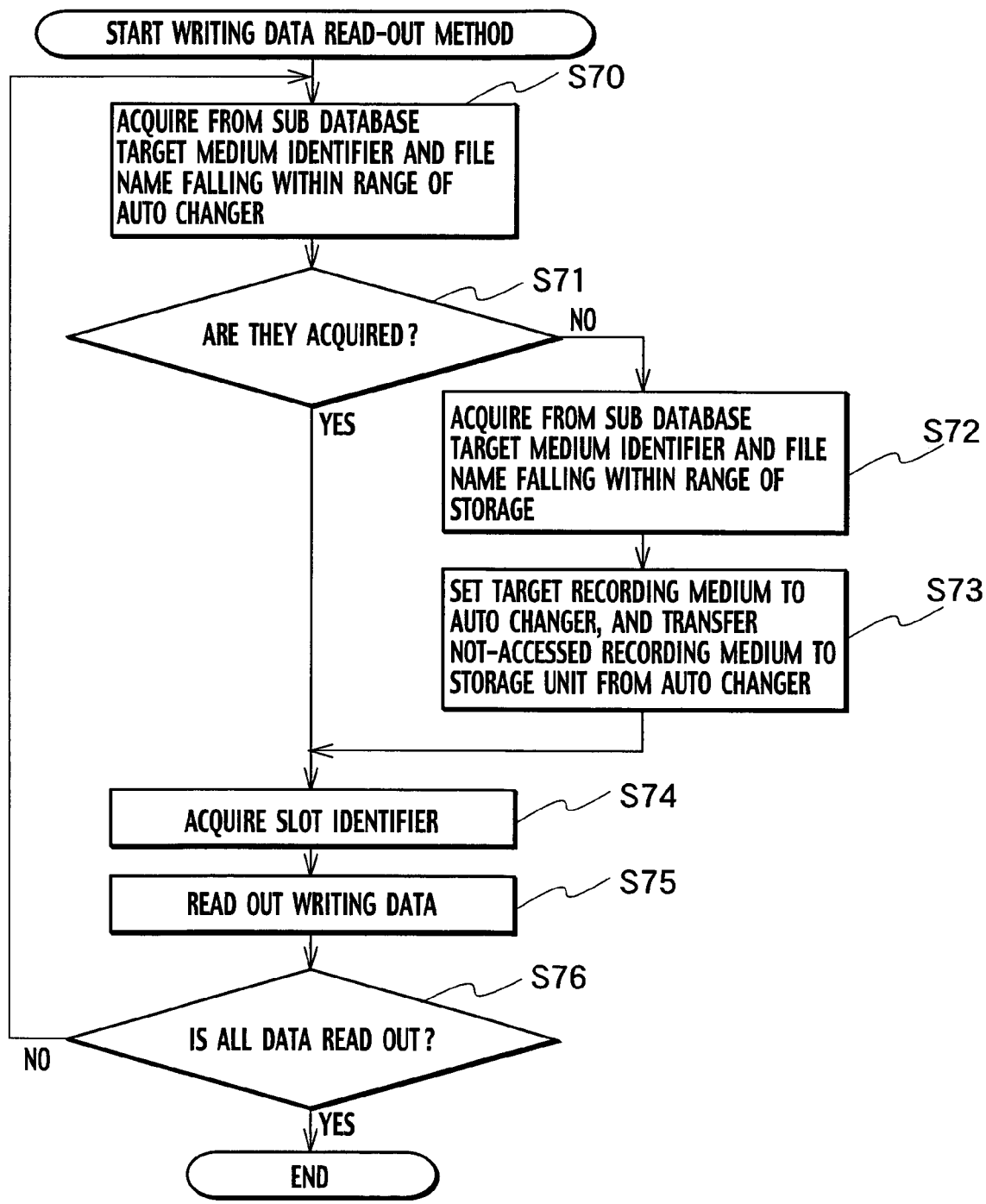
FIG. 29 is a flowchart for a method of reading out writing data from the central memory unit.

Next, when the plant mediator 37 reads out the writing data D3 from the central memory unit 36 in step S48 of FIG. 16 of the second embodiment, a writing data read-out method as shown in FIG. 29 is used. It is considered that the central memory unit 36 is in a state capable of receiving a product name, a layer name, and a writing device type that is associated with the writing data D3, and also transmitting the writing data D3.

To begin with, in step S70, based on the sub EB database 117, the medium identifier acquisition unit 111 acquires the file name and the medium identifier specified by a product name, a layer name, and a writing device type, from file names and medium identifiers for the recording media included in the auto-changer 119.

In step S71, the medium identifier acquisition unit 111 determines whether the medium identifier and the file name have been acquired. If the medium identifier and the file name have been acquired, this process proceeds to step S74. Otherwise, if the medium identifier and the file name could not be acquired, this process proceeds to step S72.

In step S72, based on the sub EB database 117, the medium identifier acquisition unit 111 acquires the file name and the medium identifier specified by a product name, a layer name, and a writing device type of a recording medium included in the storage unit 120.

In step S73, the medium transfer control unit 115 and the medium loading/unloading units 122 and 124 transfer to the storage unit 120 one of the recording media DVDs 1 through 4 in the slots 1 through 4 in the say way as in step S66. The medium loading/unloading units 122 and 124 transfer that one of the recording media DVDs 1 through 4 in the storage unit 120 specified by the medium identifier acquired in step S70, to available slots 1 through n. The medium transfer control unit 115 changes the medium identifiers corresponding to the slot identifiers of the slots 1 through n in which the recording media DVDs 1 through 4 are replaced, on the slot identifier/recording medium identifier database 118. The medium transfer control unit 115 stores an identifier in the field 128 that identifies, in either of which the slots or the storage unit 120, the recording media DVDs 1 through 4 are stored. The acquisition in steps S70 and S72 may be carried out using the field 128.

Even if the recording medium on which the to-be-read-out writing data D3 is recorded is not stored in the auto changer 119 but in the storage unit 120, reading out the writing data D3 is possible.

In step S74, the slot identifier acquisition unit 112 acquires a slot identifier from the medium identifier based on the slot identifier/recording medium identifier database 118.

In step S75, the recording medium drive 121 reads out the writing data specified by a file name, from the recording media DVDs 1 through 4 ejected from the slots 1 through n specified by the acquired slot identifiers.

In step S76, the recording medium drive 121 determines whether all writing data D3 has been read out. If all data has not been read out, this process returns to step S70. Otherwise, if all data has been read out, this process using the writing data D3 read-out method is over.

As described above, according to the fifth embodiment, a semiconductor device design system that manages writing data to be used for EB direct writing in fabrication of the semiconductor devices can be provided. In addition, according to the fifth embodiment, a semiconductor device fabrication system that manages writing data to be used for EB direct writing in fabrication of the semiconductor devices can be provided. The present invention may be embodied in other specific forms without departing from the spirit or essential characteristics thereof. The embodiments are therefore to be considered in all respects as illustrative and not restrictive, the scope of the present invention being indicated by the appended claims rather than by the foregoing description, and all changes which come within the meaning and range of equivalency of the claims are therefore intended to be embraced therein.

What is claimed is:

1. A system for delivering writing data through a network to a plant, which fabricates a semiconductor device by direct writing using the writing data, the system comprising:
   a data conversion unit configured to generate the writing data used in the direct writing, the data being specified by a product name of the semiconductor device, a layer name, and a machine type of an electron beam lithography system used for the direct writing;
   a central memory unit configured to record the writing data; and
   a plant mediator configured to distribute the writing data to the plant through the network, and to re-distribute the data to the plant in response to a download request associated with the product name, the layer name, and the machine type from the plant.

2. The system as claimed in claim 1, wherein the central memory unit comprises:
   a plurality of slots, each of which specified by a slot identifier, allowing insertion and ejection of a recording medium;
   an identifier generation unit configured to generate a sub database allowing identification of a medium identifier from the product name, the layer name, and the machine type, to record the medium identifier on the recording medium, and to generate a slot-medium database allowing identification of the slot identifier for one of the slots, which is loaded with the recording medium having the medium identifier;
   a first acquisition unit configured to acquire the slot identifier from the medium identifier based on the slot-medium database; a file name generation unit configured to generate a file name specified by the product name, the layer name, and the machine type; and
   a memory driver configured to record the file name and the data specified by the product name, the layer name, and the machine type on the recording medium loaded in the slot specified by the acquired slot identifier.

3. The system as claimed in claim 2, wherein the central memory unit further comprises a second acquisition unit configured to acquire the medium identifier specified by the product name based on the sub database.

4. The system as claimed in claim 3, wherein:
   the second acquisition unit acquires the file name and the medium identifier specified by the product name, the layer name, and the machine type based on the sub database;

the first acquisition unit acquires the slot identifier from the medium; and the memory driver reads out the data specified by the file name, from the recording medium loaded in the slot specified by the acquired slot identifier.

5. The system as claimed in claim 4, wherein the central memory unit further comprises a storage unit configured to insert the recording medium in the slot and to eject the recording medium from the slot.

6. The system as claimed in claim 1, wherein the data conversion unit generates correction data for correction of writing using the data for one layer of the semiconductor device, by using the data for another layer under the one layer.

7. A system connected to a first network for fabricating a semiconductor device, the system comprising:
a design mediator configured to receive at least one of circuit data and layout data from a design unit through the first network;
a data conversion unit configured to generate writing data used in direct writing by converting from at least one of the circuit data and the layout data, the writing data being specified by a product name of the semiconductor device, a layer name, and a machine type of an electron beam lithography system used for the direct writing;
a central memory unit configured to record the writing data;
a plant mediator configured to distribute the writing data through a second network;
a control unit configured to receive the writing data from the plant mediator through the second network;
a plant memory unit configured to record the received writing data; and
a lithography system configured to carry out the direct writing using the writing data and fabricating the semiconductor device.

8. The system as claimed in claim 7, further comprising:
a process flow memory unit configured to store a process flow information of a semiconductor device fabrication including an electron beam writing process with a process condition information of the product name the layer name, and the machine type; and
a lot status memory unit configured to store a lot information including the product name, the layer name, the machine type, a lot number of a first lot of the semiconductor device, an entry time specified by the lot number, and a removability flag when the first lot enters a plant, the lot status memory unit being configured to change the entry time to an exit time, and changing the removability flag from a first state to a second state when the first lot exits from the plant;
wherein the control unit removes the writing data specified by the product name, the layer name, and the machine type in the lot information including the removability flag in the second state, from the plant memory unit, and transmits the product name, the layer name, and the machine type to the plant mediator when a second lot of the semiconductor device with the same product name, the same layer name, and the same machine type enters the plant, and
the central memory unit extracts the writing data specified by the product name, the layer name, and the machine type.

9. The system as claimed in claim 8, wherein:
the data conversion unit generates a correction data for correction of writing using the writing data for one layer of the semiconductor device, by using the writing data for another layer under the one layer;
the process flow memory unit further stores the process flow information including a layer name for the correction data, and
the lot status memory unit further stores the lot information including the layer name for the correction data.

10. The system as claimed in claim 7, wherein the central memory unit comprises:
a plurality of slots, each of which specified by a slot identifier, allowing insertion and ejection of a recording medium;
an identifier generation unit configured to generate a sub database allowing identification of a medium identifier based on a product name of the semiconductor device, a layer name, and a machine type of the electron beam lithography system, to record the medium identifier on the recording medium, and to generate a slot-medium database allowing identification of the slot identifier for one of the slots, which is loaded with the recording medium with the medium identifier;
a first acquisition unit configured to acquire the slot identifier from the medium identifier based on the slot-medium database;
a file name generation unit configured to generate a file name specified by the product name, the layer name, and the machine type; and
a memory driver configured to record the file name and the writing data specified by the product name, the layer name, and the machine type on the recording medium loaded in the slot specified by the acquired slot identifier.

11. The system as claimed in claim 10, wherein the central memory unit further comprises a second acquisition unit configured to acquire the medium identifier specified by the product name based on the sub database.

12. The system as claimed in claim 11, wherein:
the second acquisition unit acquires the file name and the medium identifier specified by the product name, the layer name, and the machine type based on the sub database;
the first acquisition unit acquires the slot identifier from the medium identifier based on the slot-medium database; and
the memory driver reads out the writing data specified by the file name from the recording medium loaded in the slot specified by the acquired slot identifier.

13. A system connected to a network for fabricating a semiconductor device, the system comprising:
a control unit configured to receive writing data used in direct writing from a design system through the network, the writing data being specified by a product name of the semiconductor device, a layer name, and a machine type used for the direct writing;
a plant memory unit configured to record the writing data, the writing data to be erased after the direct writing is carried out; and
a lithography system configured to carry beam the direct writing using the writing data,
wherein the control unit retrieves the writing data stored in the plant memory unit, issues a download request for the writing data to the design system when the writing data is erased or not received, and receives the writing data again from the design system.

14. A method of delivering writing data to be received via a network by a plant, which carries out electron beam direct writing using the writing data and fabricates a semiconductor device by direct writing, the method comprising:
  generating the writing data;
  recording the writing data; and
  distributing the writing data to the plant through the network and redistributing the writing data to the plant in response to a download request from the plant;
  wherein the record of the writing data comprises associating the writing data with a product name of the semiconductor device, a layer name, and a machine type of an electron beam lithography system to be used for the direct writing in the plant.

15. A method for fabricating a semiconductor device by direct writing, the method comprising:
  receiving from a design unit through a first network, at least one of circuit data and layout data convertable to writing data;
  generating the writing data used in direct writing based on at least one of the circuit data and the layout data, the writing data being specified by a product name of the semiconductor device, a layer name, and a machine type of an electron beam lithography system used for the direct writing;
  recording the generated writing data in a central memory unit;
  distributing the writing data to a plant through a second network;
  recording the writing data received by the plant, in a plant memory unit; and
  carrying out electron beam direct writing using the writing data.

16. The method as claimed in claim 15, further comprising:
  storing a process flow information for fabricating the semiconductor device including an electron beam writing process with a process condition information of the product name, the layer name, and the machine type;
  storing lot information including the product name, the layer name, the machine type, a lot number of a first lot of the semiconductor device, an entry time specified by the lot number, and a removability flag when the first lot enters a plant, changing the entry time to an exit time and changing the removability flag from a first state to a second state when the first lot exits from the plant;
  removing writing data specified by the product name, the layer name, and the machine type in the lot information including the removability flag in the second state, from the plant memory unit, and transmitting the product name, the layer name, and the machine type to the central memory unit when a second lot of the semiconductor device with the same product name, the same layer name, and the same machine type enters the plant; and
  extracting the writing data specified by the product name, the layer name, and the machine type by the central memory unit.

17. The method as claimed in claim 16, further comprising:
  generating correction data for correction of writing using the writing data for one layer of the semiconductor device, by using the writing data for another layer under the one layer,
  wherein the process flow information comprises a layer name for the correction data; and the lot information comprises the layer name for the correction data.

18. A method for fabricating a semiconductor device by direct writing, the method comprising:
  receiving writing data used in direct writing from a design system through a network, the writing data being specified by a product name of the semiconductor device, a layer name to be written through direct writing, and a machine type used for the direct writing;
  recording the writing data in a plant memory unit;
  carrying out electron beam direct writing using the writing data;
  removing the writing data from the plant memory unit after electron beam direct writing using the writing data has been carried out; and
  retrieving the writing data stored in the plant memory unit, issuing a download request for the writing data to the design system when the writing data is not stored, and receiving the writing data again from the design system.

19. The method as claimed in claim 18, further comprising:
  storing a process flow information for fabricating the semiconductor device including an electron beam writing process with a process condition information of the product name, the layer name, and the machine type;
  storing lot information including the product name, the layer name, the machine type, a lot number of a first lot of the semiconductor device, an entry time specified by the lot number, and a removability flag when the first lot enters a plant, changing the entry time to an exit time and changing the removability flag from a first state to a second state when the first lot exits from the plant; and
  removing from the plant memory unit the writing data specified by the product name, the layer name, and the machine type included in the lot information including the removability flag in the second state.

* * * * *